United States Patent
Watanabe et al.

(10) Patent No.: US 9,172,028 B2
(45) Date of Patent: Oct. 27, 2015

(54) SEMICONDUCTOR DEVICE

(71) Applicant: Renesas Electronics Corporation, Kawasaki-shi, Kanagawa (JP)

(72) Inventors: Takahito Watanabe, Kanagawa (JP); Shintaro Yamamichi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 16 days.

(21) Appl. No.: 13/752,247

(22) Filed: Jan. 28, 2013

(65) Prior Publication Data

US 2013/0256819 A1 Oct. 3, 2013

(30) Foreign Application Priority Data

Mar. 28, 2012 (JP) .................................. 2012-073760

(51) Int. Cl.
*H01L 43/02* (2006.01)
*H01L 23/552* (2006.01)
(Continued)

(52) U.S. Cl.
CPC .............. *H01L 43/02* (2013.01); *H01L 23/295* (2013.01); *H01L 23/552* (2013.01); *H01L 24/34* (2013.01); *H01L 24/97* (2013.01); *H01L 24/06* (2013.01); *H01L 24/32* (2013.01); *H01L 24/48* (2013.01); *H01L 24/49* (2013.01); *H01L 24/73* (2013.01); *H01L 24/85* (2013.01); *H01L 2224/0401* (2013.01); *H01L 2224/04042* (2013.01);
(Continued)

(58) Field of Classification Search
CPC ....... H01L 23/48; H01L 23/552; H01L 23/02; H01L 23/28; H01L 43/02; H01L 24/97; H01L 23/295; H01L 24/34; H01L 2924/13091; H01L 24/06; H01L 24/32; H01L 24/48; H01L 24/49; H01L 24/73; H01L 24/85

See application file for complete search history.

(56) References Cited

U.S. PATENT DOCUMENTS 6,097,080 A * 8/2000 Nakanishi et al. ............. 257/659
6,625,040 B1 * 9/2003 Tuttle ............................ 361/816
(Continued)

FOREIGN PATENT DOCUMENTS

| JP | 2003-309196 A | 10/2003 |
|---|---|---|
| JP | 2010-153760 A | 7/2010 |

(Continued)

OTHER PUBLICATIONS

Japanese Office Action dated Aug. 18, 2015 with an English translation.

*Primary Examiner* — David Vu
*Assistant Examiner* — Mouloucoulaye Inoussa
(74) *Attorney, Agent, or Firm* — McGinn IP Law Group, PLLC

(57) ABSTRACT

A yield of semiconductor devices having a magnetic shield is enhanced. A magnetic shield member SIE has a first shield member SIE1 and a second shield member SIE2. The first shield member SIE1 has a first facing region FP1 facing a first surface of a semiconductor chip SC. The second shield member SIE2 has a second facing region FP2 facing a second surface of the semiconductor chip SC. A resin layer RL1 has a portion thereof making contact with the first shield member SIE1, and has another portion thereof making contact with the second shield member SIE2. Then, the first shield member SIE1 and the second shield member SIE2 are magnetically coupled via the resin layer RL1 or directly. The first shield member SIE1 and the second shield member SIE2 cover a magnetic memory cell MR in plan view.

18 Claims, 58 Drawing Sheets

(51) Int. Cl.
*H01L 23/29* (2006.01)
*H01L 23/48* (2006.01)
*H01L 23/00* (2006.01)

(52) U.S. Cl.
CPC .................. *H01L2224/06155* (2013.01); *H01L 2224/16225* (2013.01); *H01L 2224/16227* (2013.01); *H01L 2224/32225* (2013.01); *H01L 2224/32245* (2013.01); *H01L 2224/4824* (2013.01); *H01L 2224/4826* (2013.01); *H01L 2224/48227* (2013.01); *H01L 2224/48247* (2013.01); *H01L 2224/49175* (2013.01); *H01L 2224/73203* (2013.01); *H01L 2224/73221* (2013.01); *H01L 2224/73253* (2013.01); *H01L 2224/73265* (2013.01); *H01L 2224/8592* (2013.01); *H01L 2224/97* (2013.01); *H01L 2924/13091* (2013.01); *H01L 2924/1431* (2013.01); *H01L 2924/1434* (2013.01); *H01L 2924/15311* (2013.01); *H01L 2924/3025* (2013.01)

(56) References Cited

U.S. PATENT DOCUMENTS

| | | | |
|---|---|---|---|
| 8,247,888 B2 | 8/2012 | Masuda et al. | |
| 8,258,604 B2 | 9/2012 | Bando et al. | |
| 2001/0030059 A1* | 10/2001 | Sugaya et al. | 174/256 |
| 2009/0029506 A1* | 1/2009 | Fujii et al. | 438/127 |
| 2011/0316129 A1* | 12/2011 | Katti | 257/659 |

FOREIGN PATENT DOCUMENTS

| | | |
|---|---|---|
| JP | 2011-014879 A | 1/2011 |
| WO | WO 2011/111789 A1 | 9/2011 |

* cited by examiner

SEMICONDUCTOR DEVICE

CROSS-REFERENCE TO RELATED APPLICATION

The disclosure of Japanese Patent Application No. 2012-073760 filed on Mar. 28, 2012 including the specification, drawings and abstract is incorporated herein by reference in its entirety.

BACKGROUND

The present invention relates to a semiconductor device, and more specifically relates to a semiconductor device having a magnetic memory cell.

Magnetic memory cells (MRAM: Magnetoresistive Random Access Memory) as an example of memory cells are under development for practical use. Such magnetic memory cell is a cell that writes information by rewriting the orientation of the electronic spin. Therefore, in the magnetic memory cell, information may be erased or written incorrectly by an external static magnetic field. In contrast to this, a structure of covering a semiconductor chip having a magnetic memory cell with a magnetic shield is discussed as shown, for example, in International Publication No. 2011/111789 (Patent Document 1).

SUMMARY

A high yield is important in a case of productization of a technique related to semiconductor devices. The present inventor considered it necessary to contrive a structure for a higher yield of semiconductor devices having a magnetic shield described in Patent Document 1. The other problems and the new feature will become clear from the description of the present specification and the accompanying drawings.

According to one embodiment, a magnetic shield member has a first shield member, a second shield member, and a resin layer. The first shield member has a first facing region. The first facing region faces a first surface of a semiconductor chip. The second shield member has a second facing region. The second facing region faces a second surface of the semiconductor chip. The resin layer has a portion thereof making contact with the first shield member and another portion making contact with the second shield member.

According to the one embodiment, the yield of semiconductor devices having a magnetic shield can be increased.

DETAILED DESCRIPTION

Hereinafter, embodiments of the present invention will be explained using the drawings. Note that, in all the drawings, the same symbol is attached to the same component and the explanation thereof is appropriately omitted.

Embodiment

Figure 1:
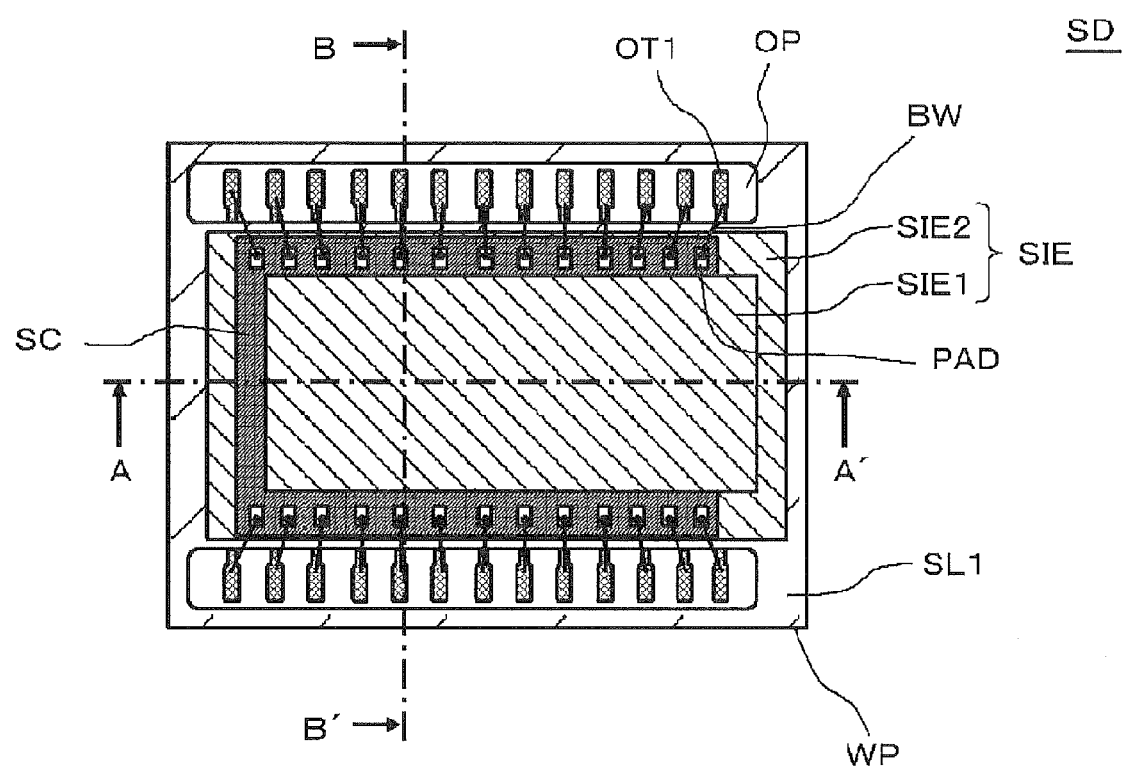
FIG. 1 is a plan view illustrating a configuration of a semiconductor device according to an embodiment.
Figure 2A:
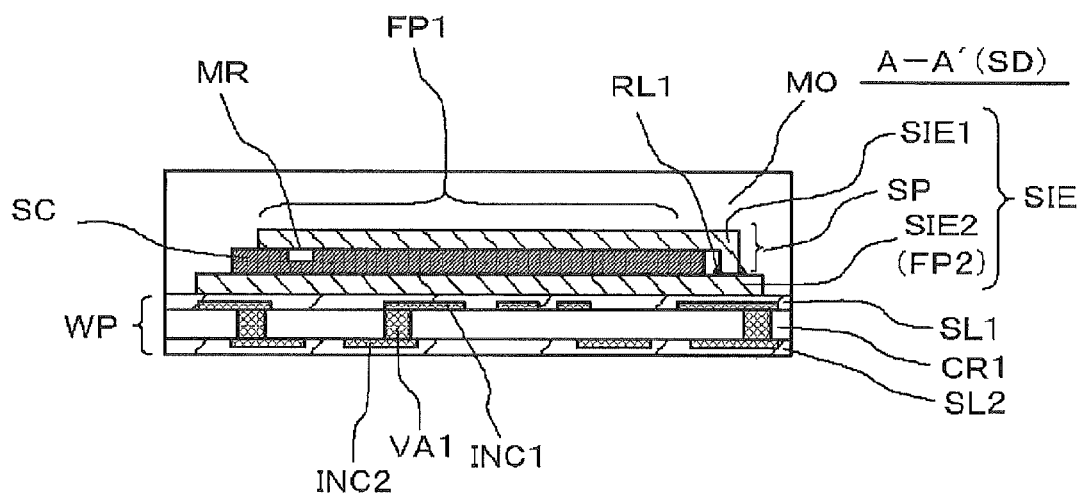
FIG. 2A is an A-A' cross-sectional view of FIG. 1
Figure 2B:
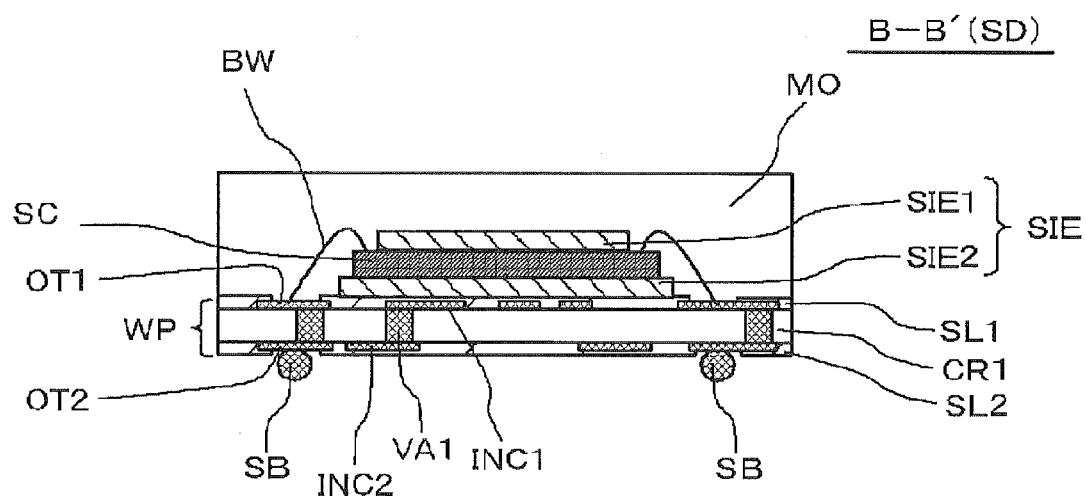
FIG. 2B is a B-B' cross-sectional view of FIG. 1.

FIG. 1 is a plan view illustrating a configuration of a semiconductor device SD according to an embodiment. FIG. 2A is an A-A' cross-sectional view of FIG. 1. FIG. 2B is a B-B' cross-sectional view of FIG. 1. The semiconductor device SD has a semiconductor chip SC and a magnetic shield member SIE.

The semiconductor chip SC has a magnetic memory cell MR as illustrated in FIG. 2A. The magnetic memory cell MR may be provided in a plurality of areas in the semiconductor chip SC, while only one is illustrated in FIG. 2A. The semiconductor chip SC may be a memory chip and may also be a chip having both a memory cell and a logic circuit mounted thereon.

The magnetic shield member SIE has a first shield member SIE1 and a second shield member SIE2. The first shield member SIE1 has a first facing region FP1. The first facing region FP1 faces a first surface of the semiconductor chip SC. In the example illustrated in FIGS. 1, 2A, and 2B, the first surface is a surface with the magnetic memory cell MR formed therein (active surface). The second shield member SIE2 has a second facing region FP2. The second facing region FP2 faces a second surface of the semiconductor chip SC. The second surface is a surface on the side opposite to the first surface. In the example illustrated in FIGS. 1, 2A, and 2B, the second surface is a back surface of the semiconductor chip SC. Note that, in the following embodiments and modifications, the first shield member SIE1 and the second shield member SIE2 may also be opposite in shape.

The first shield member SIE1 and the second shield member SIE2 have only to overlap at least with the magnetic memory cell MR in plan view, respectively. However, a plurality of magnetic memory cells MR is sometimes provided dispersively in the semiconductor chip SC. In such a case, the first shield member SIE1 and the second shield member SIE2 result in covering the entire surface of the regions provided with internal circuits in the semiconductor chip SC.

In the portion not overlapping with the semiconductor chip SC in plan view between the first shield member SIE1 and the second shield member SIE2, a resin layer RL1 is located. The resin layer RL1 has a portion thereof making contact with the first shield member SIE1 and another portion thereof making contact with the second shield member SIE2. Then, the first shield member SIE1 and the second shield member SIE2 are coupled magnetically via the resin layer RL1 or directly. The first shield member SIE1 and the second shield member SIE2 cover the magnetic memory cell MR in plan view.

In detail, the first shield member SIE1 illustrated in FIGS. 1, 2A, and 2B has a side facing region SP as well as the first facing region FP1. The side facing region SP faces a side of the semiconductor chip SC. That is, the first shield member SIE1 extends along the active surface of the semiconductor chip SC, followed by bending at approximately 90° to extend along the side of the semiconductor chip SC. The resin layer RL1 makes contact at least with an end portion of the side facing region SP.

As illustrated in FIG. 1, the active surface of the semiconductor chip SC is provided with a plurality of electrode pads PAD. The semiconductor chip SC has a planar shape of a quadrilateral (for example, a rectangle), and the electrode pads PAD are provided along two sides of the semiconductor chip SC facing each other. The first shield member SIE1 is provided so as not to interfere with the electrode pads PAD. That is, in plan view, the first shield member SIE1 has a width (vertical length in FIG. 1) narrower than that of the semiconductor chip SC and is located between the two columns of the electrode pads PAD. In contrast, the second shield member SIE2 has a width equivalent to or larger than that of the semiconductor chip SC.

Then, the side facing region SP of the magnetic shield member SIE is provided along a side not provided with the electrode pads PAD of the semiconductor chip SC. That is, in plan view, the first shield member SIE1 sticks out of the semiconductor chip SC in the side not provided with the electrode pads PAD of the semiconductor chip SC. Then, the sticking out portion is provided with the side facing region SP.

Figure 57:
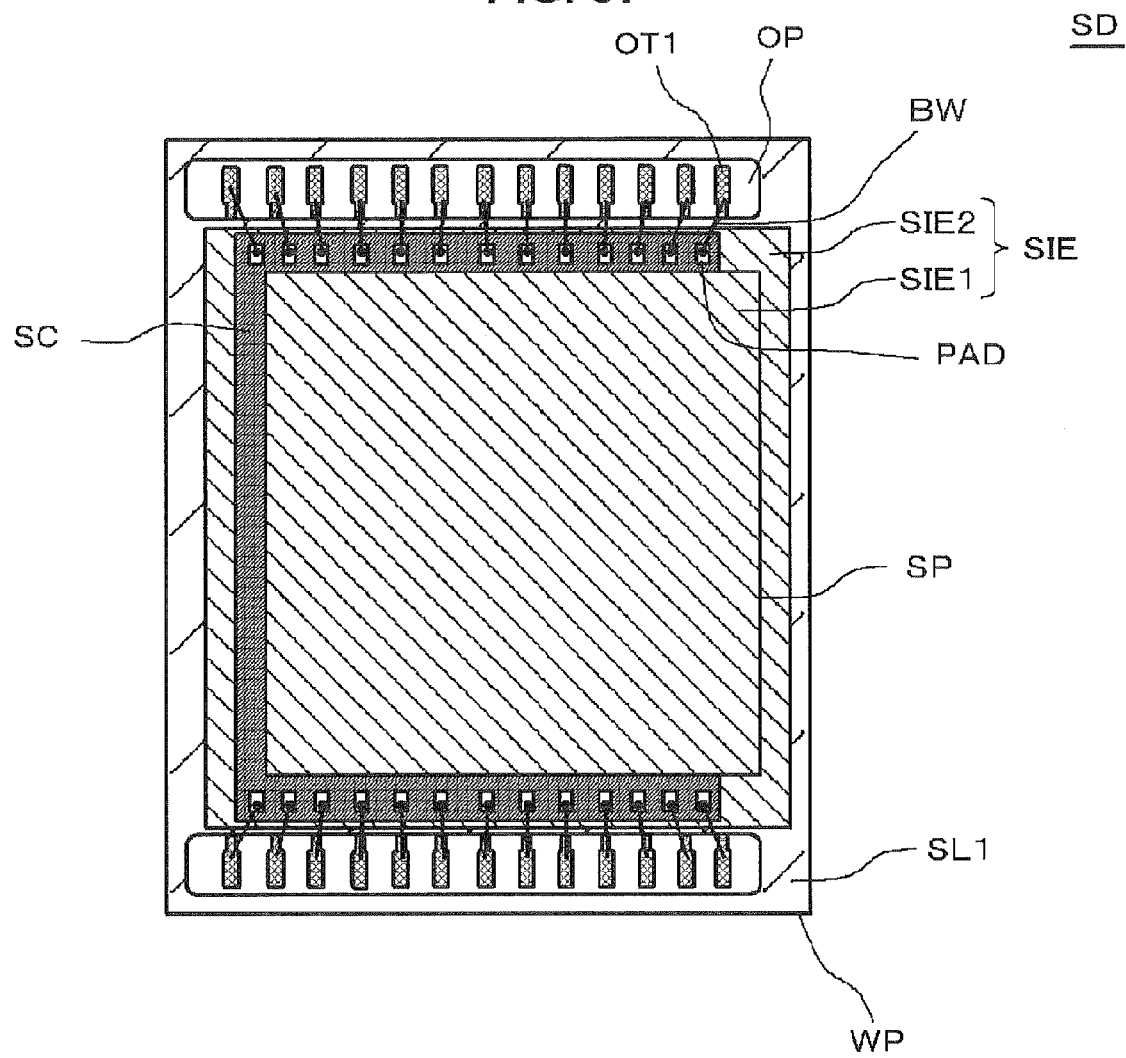
FIG. 57 is a plan view illustrating a configuration of a semiconductor device according to another embodiment.

In the example illustrated in FIGS. 1, 2A, and 2B, the semiconductor chip SC has a planar shape of a rectangle. The electrode pads PAD are provided along a longer side of the semiconductor chip SC. Then, the side facing region SP is provided along a shorter side of the semiconductor chip SC. However, as illustrated in FIG. 57, the semiconductor chip SC may also be provided with the electrode pads PAD along a shorter side thereof and be provided with the side facing region SP along a longer side of the semiconductor chip SC.

Figure 58:
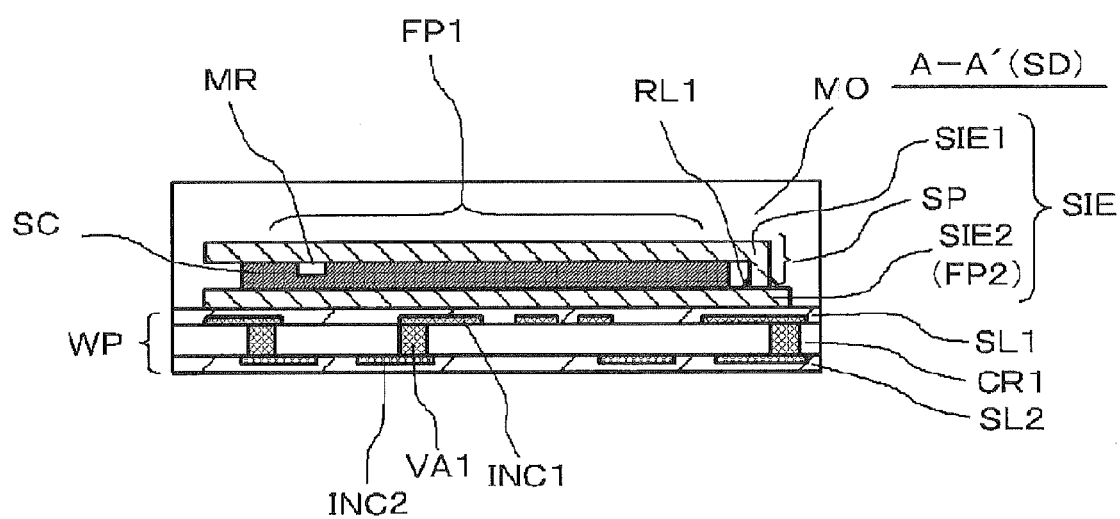
FIG. 58 is a cross-sectional view illustrating a configuration of a semiconductor device according to still another embodiment.

In addition, in the example illustrated in FIGS. 1, 2A, and 2B, an end portion on a side not provided with the side facing region SP of the first shield member SIE1 is located over the semiconductor chip SC in plan view. However, as illustrated in FIG. 58, this end portion may also be located outside the semiconductor chip SC in plan view.

Both the first shield member SIE1 and the second shield member SIE2 are formed of a soft magnetic material. The soft magnetic material is an alloy configured with, for example, FeSi, NiFe, or FeSiAl. These alloys may also contain an additive element, such as Mo, Cu, and Cr. This soft magnetic material is preferably silicon steel, permalloy, sendust, ferrite, and the like. These materials have the magnetic permeability higher than that of Cu or alloys having Cu as a main component, and thus it is possible to obtain a high magnetic shield effect to the magnetic memory cell MR. The first shield member SIE1 and the second shield member SIE2 may be formed with a material identical to each other and may also be formed of materials different from each other. The first shield member SIE1 may have a thickness identical to the thickness of the second shield member SIE2 and may also have a thickness different from each other. The thicknesses of the first shield member SIE1 and the second shield member SIE2 are, for example, not less than 100 μm and not more than 350 μm. However, the first shield member SIE1 and the second shield member SIE2 may also have the thicknesses of 100 μm or less.

The resin layer RL1 has, for example, an epoxy resin as a main component. The resin layer RL1 may have the magnetic permeability higher than that of a resin layer RL2 described later. For example, the resin layer RL1 may also be the above described resin material with a filler of a soft magnetic material (for example, silicon steel or permalloy) mixed therein. In this case, the filler is contained 10% or more, preferably 30% or more, of a cross section when cutting the resin layer RL1.

The semiconductor chip SC and the magnetic shield member SIE are mounted on a wiring board WP. In detail, a surface opposite from the semiconductor chip SC of the second shield member SIE2 is fixed to the wiring board WP. The wiring board WP is, for example, an interposer. A surface (one surface) with the second shield member SIE2 fixed thereto of the wiring board WP is provided with a plurality of coupling terminals OT1. The coupling terminals OT1 are coupled to the electrode pads PAD of the semiconductor chip SC via bonding wires BW.

In detail, a core layer CR1 has one surface provided with a wiring INC1 and the coupling terminals OT1. The wiring INC1 is covered with a protective insulating film SL1, while at least a portion of each coupling terminal OT1 is exposed from the protective insulating film SL1. The portion exposed from the protective insulating film SL1 of each coupling terminal OT1 is coupled to one end of the respective bonding wire BW. A surface of the other side of the core layer CR1 is provided with a wiring INC2 and coupling terminals OT2. The wiring INC2 is covered with a protective insulating film SL2, while at least a portion of each coupling terminal OT2 is exposed from the protective insulating film SL2. The portion exposed from the protective insulating film SL2 of each coupling terminal OT2 is coupled to a respective solder ball SB. The protective insulating film SL1 and the protective insulating film SL2 are, for example, a solder resist film.

Then, the coupling terminals OT1 are coupled to the wiring INC1, and the coupling terminals OT2 are coupled to the wiring INC2. The wiring INC1 and the wiring INC2 are electrically coupled via a via hole VA1 provided in the core layer CR1.

The semiconductor chip SC and the magnetic shield member SIE are sealed with a sealing resin MO. The sealing resin MO also makes contact with the entire surface of one surface of the wiring board WP. Then, the sides of the wiring board WP and the sides of the sealing resin MO form identical surfaces. In the sealing resin MO, an insulating filler, for example, a filler containing silicon oxide is mixed. There may also be a case where an insulating filler, a filler containing silicon oxide is mixed in the resin layer RL1. In this case, the filler of the resin layer RL1 has an average particle diameter smaller than the average particle diameter of the filler of the sealing resin MO. This enables a narrower thickness of the resin layer RL1 located between the first shield member SIE1 and the second shield member SIE2.

Figure 3:
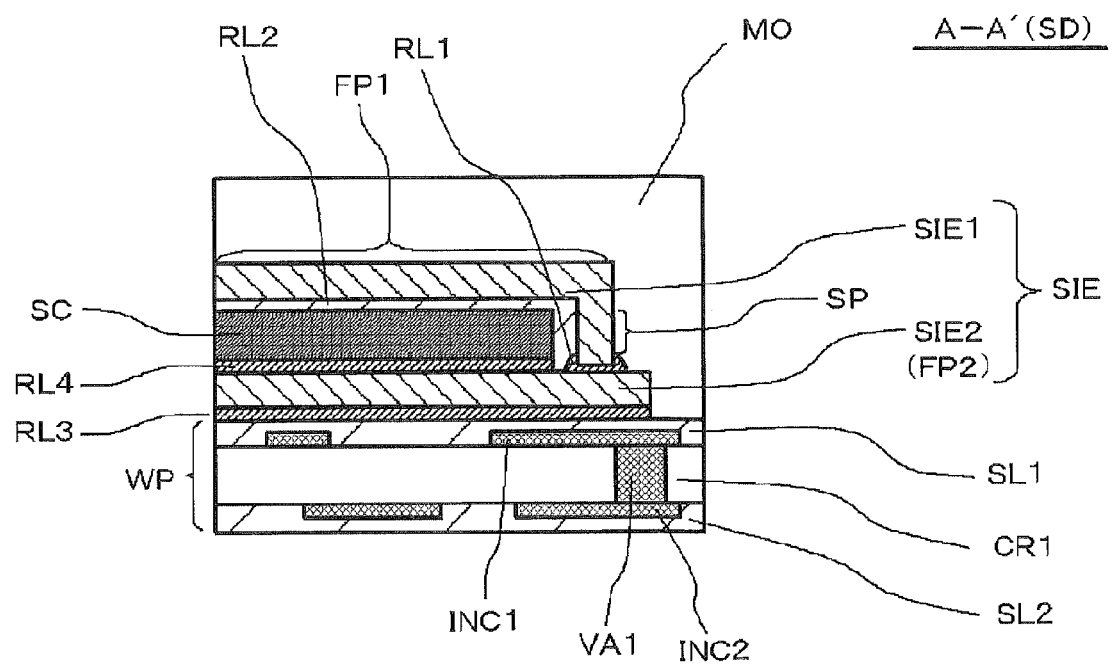
FIG. 3 is an enlarged view of the principal parts of FIG. 2A.

FIG. 3 is an enlarged view of the principal parts of FIG. 2A. As illustrated in FIG. 3, the second shield member SIE2 is fixed to the wiring board WP by using a resin layer RL3. The resin layer RL3 is, for example, a DAF (Die Attachment Film). The semiconductor chip SC is fixed to the second shield member SIE2 by using a resin layer RL4. The resin layer RL4 is, for example, a DAF. The first shield member SIE1 is fixed to the semiconductor chip SC by using a resin layer RL2. The resin layer RL2 has a portion filling a gap between a side of the semiconductor chip SC and the side facing region SP of the first shield member SIE1. The resin layer RL2 is, for example, an NCF (Non-Conductive Film), while it may also be an NCP (Non-Conductive Paste) or a DAF.

Figure 4:
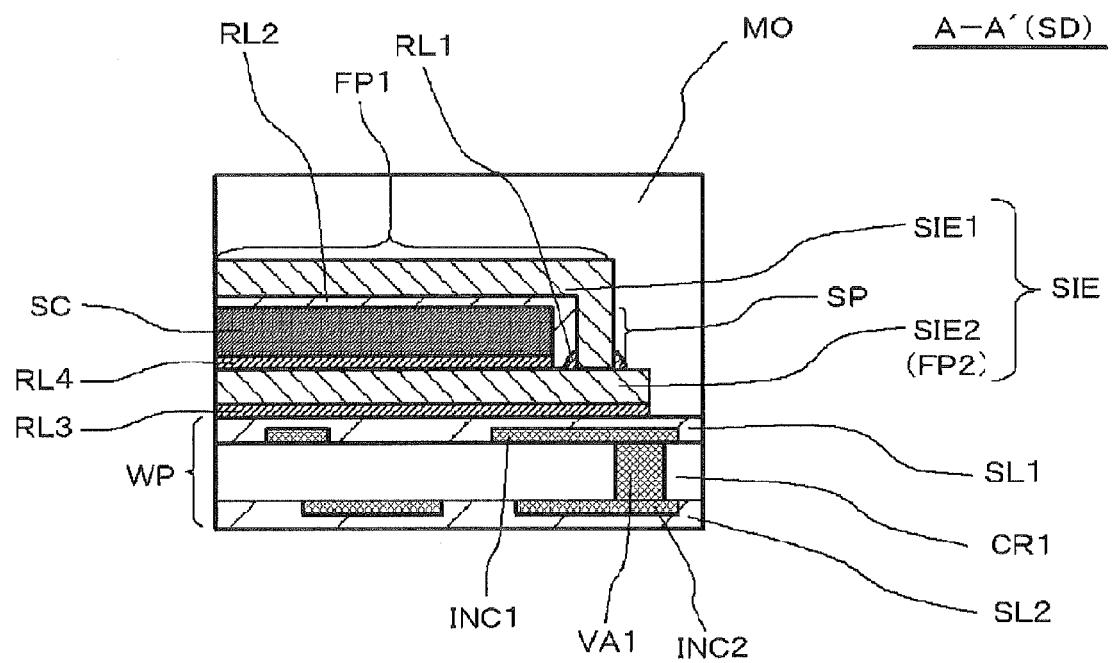
FIG. 4 is an enlarged view of the principal parts of FIG. 2A.

In the example illustrated in FIG. 3, the end portion of the side facing region SP of the first shield member SIE1 and the second shield member SIE2 are slightly separated, and the gap is filled with the resin layer RL1. However, as illustrated in FIG. 4, the end portion of the side facing region SP may also make contact with the second shield member SIE2.

Figure 5A:
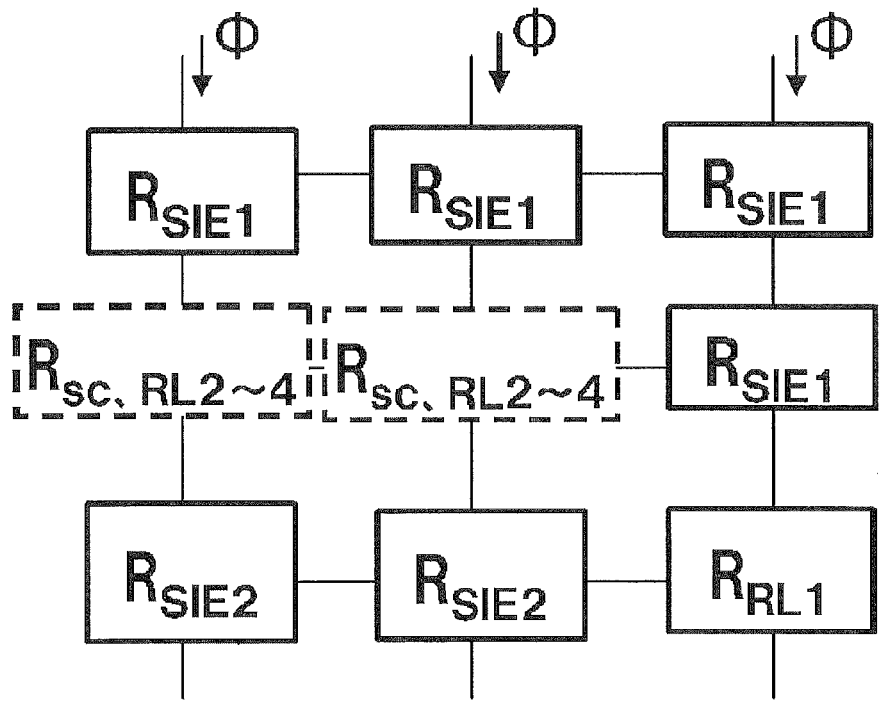
FIGS. 5A and 5B are diagrams for illustrating a magnetic shield effect by a magnetic shield member.
Figure 5B:
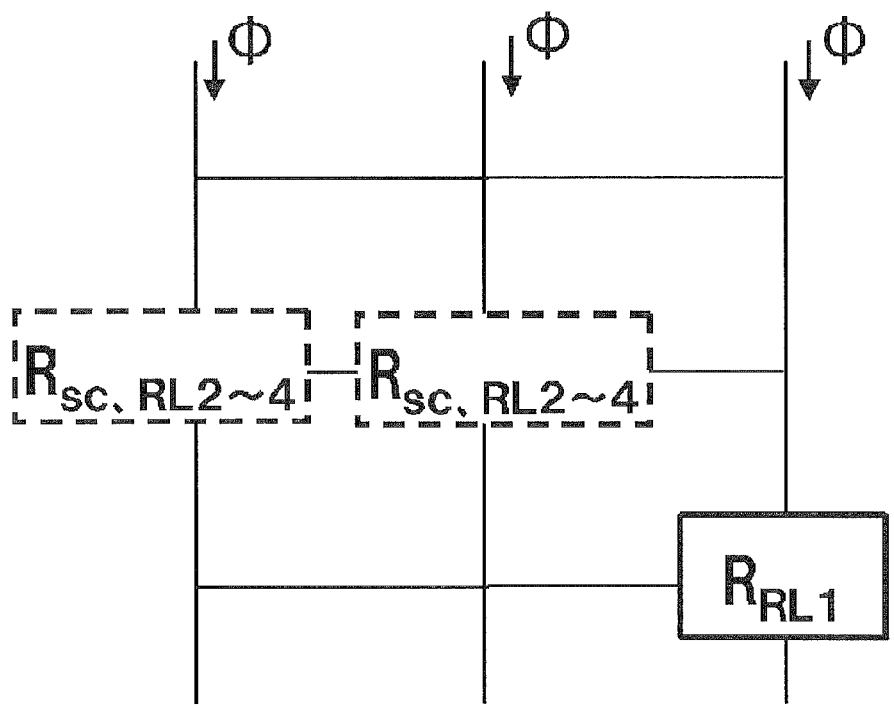

FIGS. 5A and 5B are diagrams to illustrate a magnetic shield effect by a magnetic shield member SIE. A magnetic circuit around the magnetic shield member SIE is illustrated as in FIG. 5A. Here, resistance $R_{SIE1}$ of the soft magnetic material when a magnetic field flows is sufficiently less than a sum $R_{SC, RL2-4}$ of the resistance of the material configuring the semiconductor chip SC and the materials configuring the resin layers RL2 to RL4. Therefore, FIG. 5A can be approximated to FIG. 5B. Then, since the resin layer RL1 is thin, resistance $R_{RL1}$ to flow a magnetic field is sufficiently less than the sum ($R_{SC, RL2-4}$) of the resistance of the semiconductor chip SC and the resin layers RL2 to RL4. Therefore, a magnetic field in a direction vertical to the first shield member SIE1 does not go through the semiconductor chip SC but flows in the magnetic shield member SIE. Here, it is preferred that the resistance $R_{RL1} < 3.0 \times (1/\mu_0)$ [A/Wb] holds. More preferably, the resistance $R_{RL1} < 0.75 \times (1/\mu_0)$ [A/Wb] holds.

Figure 6A:
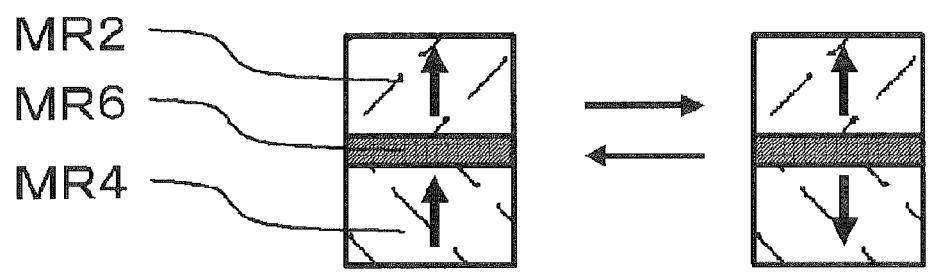
FIGS. 6A and 6B are cross-sectional views illustrating the principle of a magnetic memory cell.
Figure 6B:
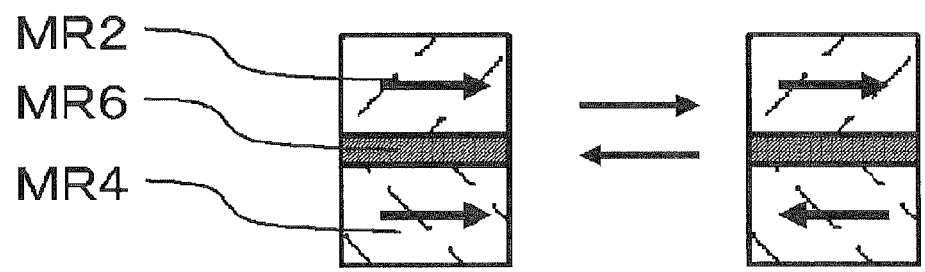

FIGS. 6A and 6B are diagrams to illustrate the principle of a magnetic memory cell MR. The magnetic memory cell MR has a structure in which a magnetic fixed layer MR2 and a magnetic free layer MR4 are faced via a tunnel barrier layer MR6. The magnetic memory cell MR illustrated in FIG. 6A is a cell of a perpendicular magnetization type. The magnetic memory cell MR of this type holds memory by the magnetization in a direction vertical to the semiconductor chip SC.

The magnetic memory cell MR illustrated in FIG. 6B is a cell of a longitudinal magnetization type. The magnetic memory cell MR of this type holds memory by the magnetization in a direction horizontal to the semiconductor chip SC. The magnetic memory cell MR of either type becomes low resistance in a case where the orientations of the magnetization in the magnetic fixed layer MR2 and the magnetic free layer MR4 are in an identical direction, and becomes high resistance in a case where the orientations of the magnetization in the magnetic fixed layer MR2 and the magnetic free layer MR4 are in opposite directions. Then, the magnitude of the tunnel current flowing through the tunnel barrier layer MR6 is measured, thereby reading out the information written therein. Then, the magnetic shield member SIE illustrated in FIG. 1 exhibits a magnetic shield effect particularly to the magnetic memory cell MR illustrated in FIG. 6A.

Figure 7A:
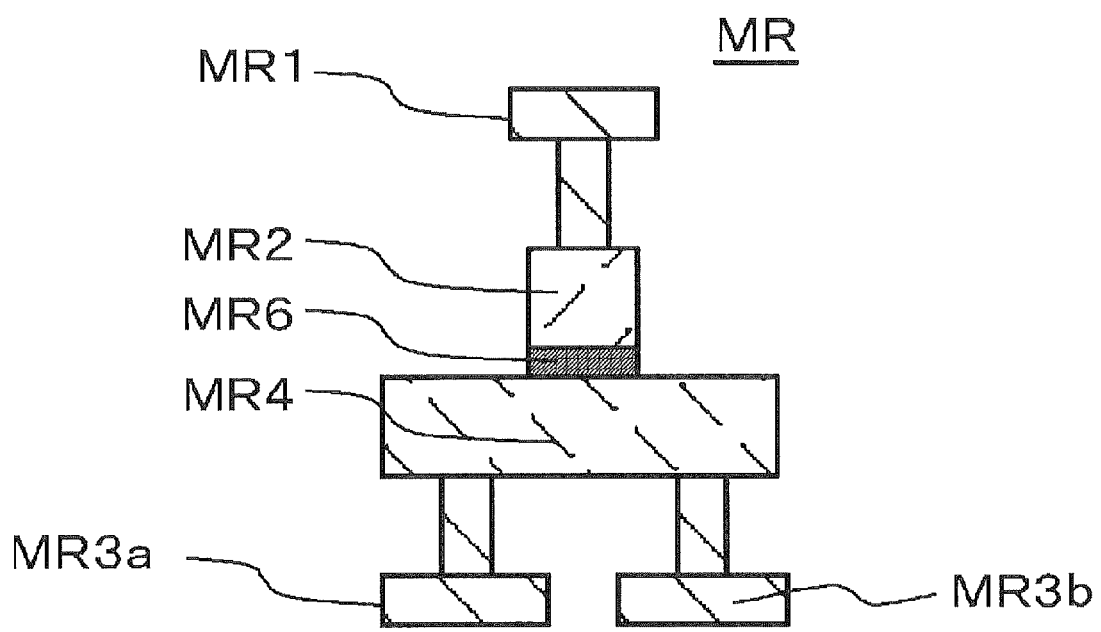
FIGS. 7A and 7B are cross-sectional views illustrating a configuration of the magnetic memory cell.
Figure 7B:
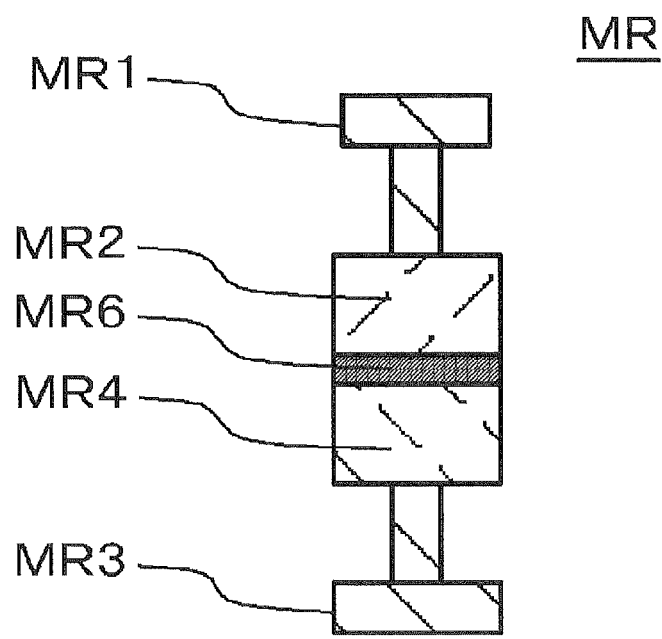

FIGS. 7A and 7B are diagrams to illustrate a configuration of the magnetic memory cell MR. The magnetic memory cell MR illustrated in FIG. 7A is a magnetic memory cell of a domain wall displacement type. Specifically, the magnetic free layer MR4 is a domain wall displacement layer and is coupled to two bit lines MR3a and MR3b. Then, the magnetic fixed layer MR2 is coupled to a read line MR1.

The magnetic memory cell MR illustrated in FIG. 7B is a magnetic memory cell of a spin injection type. Specifically, the magnetic free layer MR4 is coupled to one bit line MR3, and the magnetic fixed layer MR2 is coupled to the read line MR1.

Although the principle and the configuration of the magnetic memory cell MR have been explained using FIGS. 6A to 7B, the configuration of the magnetic memory cell MR to which the present invention is applicable is not limited to them and may also be, for example, a magnetic memory cell of a magnetic field displaced type.

FIGS. 8A to 10B are cross-sectional views illustrating the method of manufacturing a semiconductor device SD. FIGS. 8A, 8B, 10A, and 10B correspond to FIG. 3, and FIG. 9 corresponds to FIG. 2B. First, the semiconductor chip SC is prepared. The semiconductor chip SC is manufactured as follows.

First, a cell separation film is formed on a semiconductor substrate. This separates a cell formation region. The cell separation film is formed using, for example, an STI technique, while it may also be formed using a LOCOS technique. Subsequently, on the semiconductor substrate located in the cell formation region, a gate insulating film and a gate electrode are formed. The gate insulating film may be a silicon oxide film and may also be a high dielectric film (for example, hafnium silicate film) having a dielectric constant higher than that of a silicon oxide film. In a case where the gate insulating film is a silicon oxide film, the gate electrode is formed of a polysilicon film. In addition, in a case where the gate insulating film is a high dielectric film, the gate electrode is formed of a laminated film of a metal film (for example, TiN) and a polysilicon film. Furthermore, in a case where the gate electrode is formed of polysilicon, a polysilicon resistor may also be formed over a cell separation film in the step of forming the gate electrode.

Subsequently, on the semiconductor substrate located in the cell formation region, extension regions of the source and the drain are formed. Next, a side wall is formed on a side of the gate electrode. Subsequently, on the semiconductor substrate located in the cell formation region, impurity regions serving as a source and a drain are formed. In such a manner, a MOS transistor is formed over the semiconductor substrate.

Next, over the cell separation film and the MOS transistor, a multilayer wiring layer is formed. On this occasion, the magnetic memory cell MR is formed on either wiring layer, and electrode pads PAD are formed on the wiring layer in the uppermost layer. Then, over the multilayer wiring layer, a protective insulating film (passivation film) is formed. In the protective insulating film, openings located over the electrode pads PAD are formed.

After that, the semiconductor substrate in a wafer state is diced and the semiconductor chip SC is singulated into individual parts.

In addition, the wiring board WP, the first shield member SIE1, and the second shield member SIE2 are prepared.

Figure 8A:
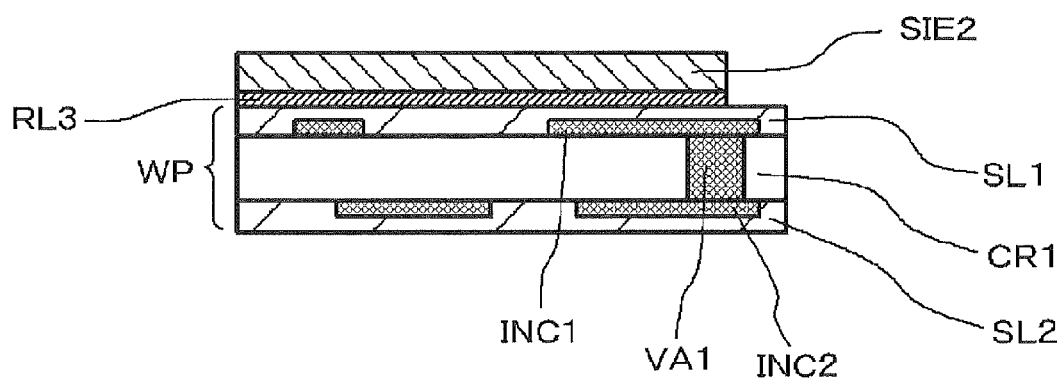
FIGS. 8A and 8B are cross-sectional views illustrating a method of manufacturing a semiconductor device.
Figure 8B:
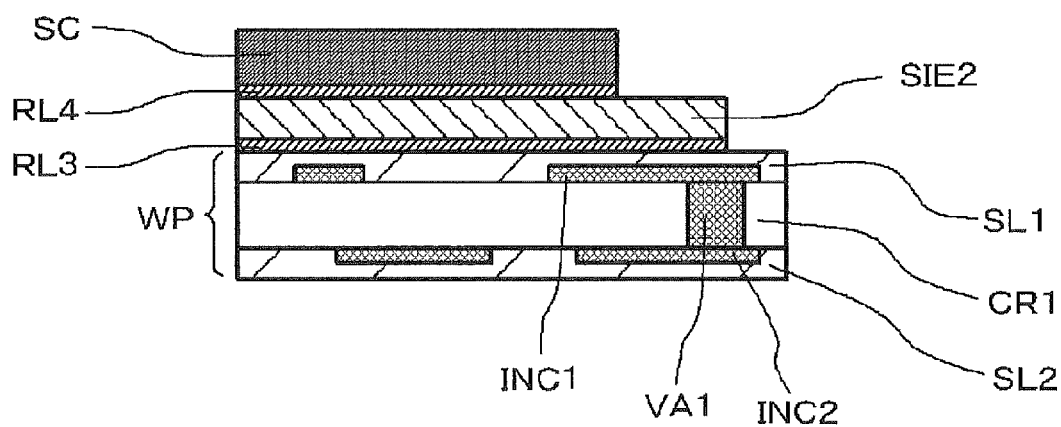

Then, as illustrated in FIG. 8A, the second shield member SIE2 is fixed over the wiring board WP by using the resin layer RL3. Subsequently, as illustrated in FIG. 8B, the semiconductor chip SC is fixed over the second shield member SIE2 by using the resin layer RL4.

Figure 9:
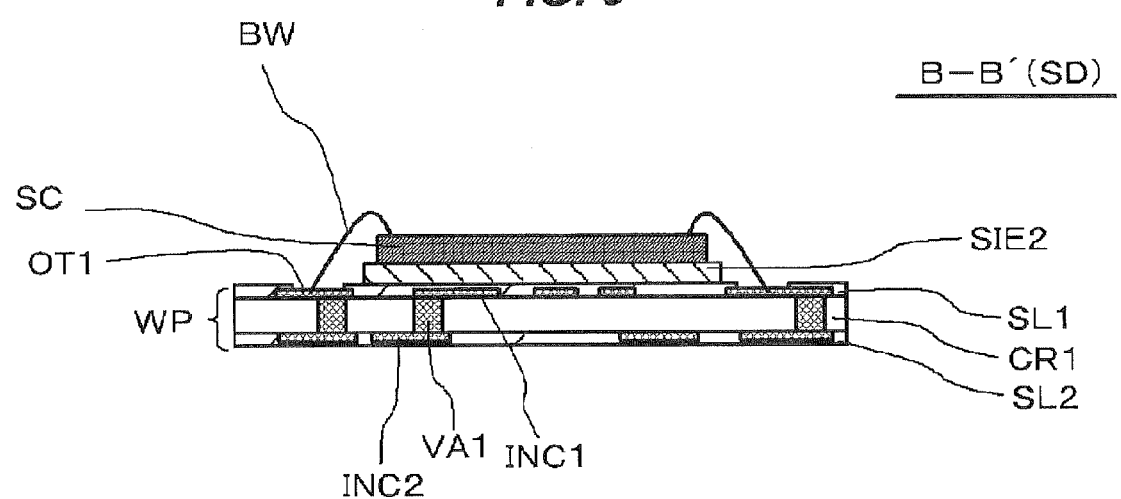
FIG. 9 is a cross-sectional view illustrating the method of manufacturing a semiconductor device.

Subsequently, as illustrated in FIG. 9, one end of each bonding wire BW is coupled to the respective coupling terminal OT1, and also the other end of each bonding wire BW is coupled to the respective electrode pad PAD. The bonding wires BW may be coupled to the coupling terminals OT1 first, and the bonding wires BW may also be coupled to the electrode pads PAD first.

Figure 10A:
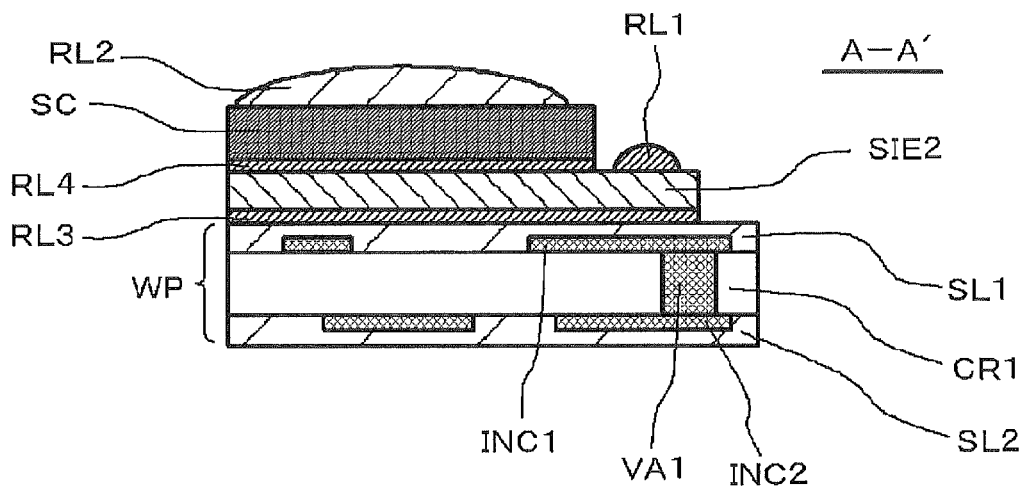
FIGS. 10A and 10B are cross-sectional views illustrating the method of manufacturing a semiconductor device.

Next, as illustrated in FIG. 10A, the resin layer RL2 is dropped over the semiconductor chip SC, and also the resin layer RL1 is dropped over the second shield member SIE2.

Figure 10B:
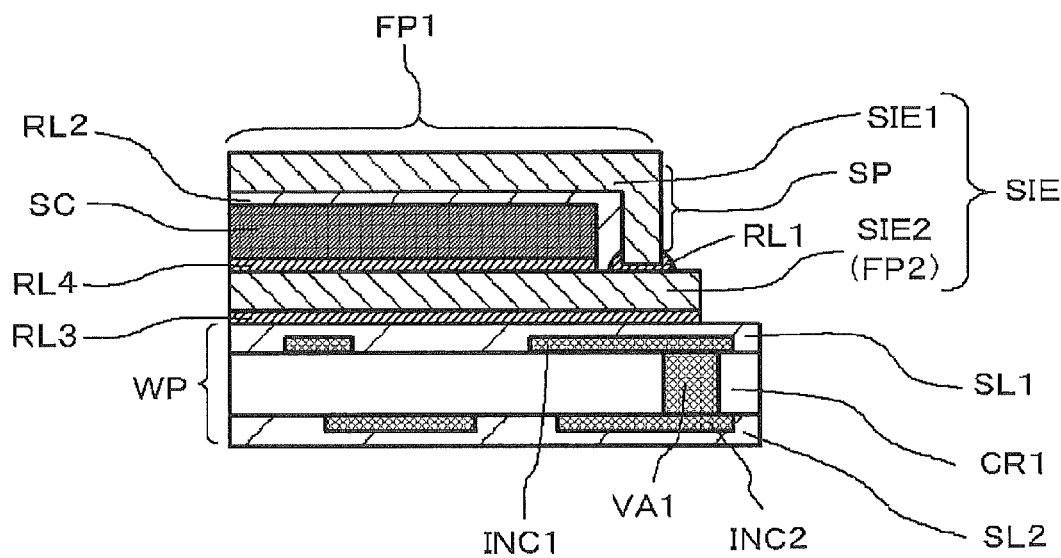

Subsequently, as illustrated in FIG. 10B, the first facing region FP1 of the first shield member SIE1 is mounted over the semiconductor chip SC and also an end portion of the side facing region SP of the first shield member SIE1 is pressed against the resin layer RL1.

After that, the semiconductor chip SC and the magnetic shield member SIB are sealed using the sealing resin MO.

Figure 11:
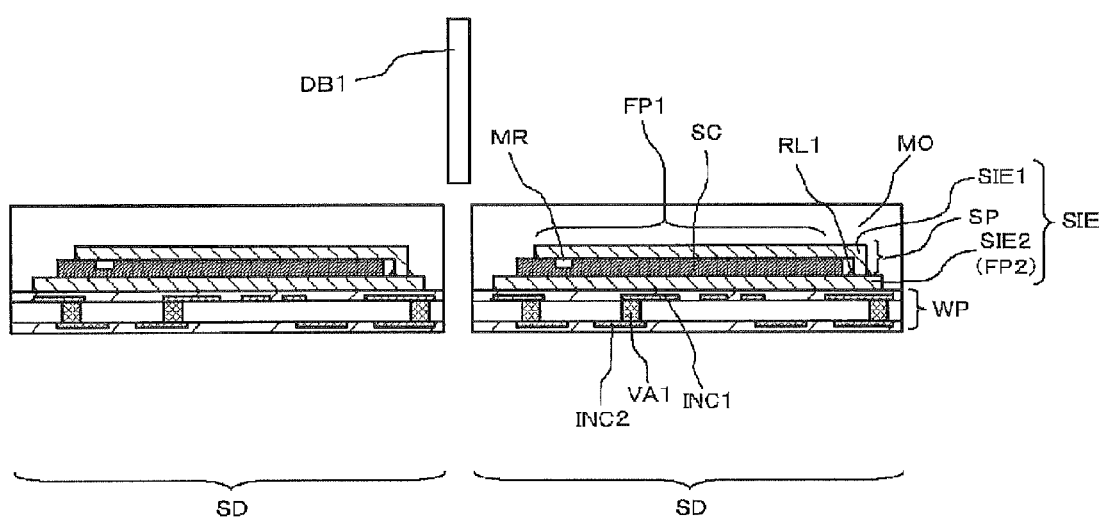
FIG. 11 is a cross-sectional view illustrating the method of manufacturing a semiconductor device.

There may be a case, in a state of linking a plurality of wiring boards WP with each other, of providing the semiconductor chip SC and the magnetic shield member SIE over each of the wiring boards WP. In this case, the semiconductor chips SC and the magnetic shield members SIE are collectively sealed with the sealing resin MO. Then, as illustrated in FIG. 11, the sealing resin MO and the wiring boards WP are cut with, for example, a dicing blade DB1, thereby singulating the semiconductor devices SD into individual parts.

The method of manufacturing a semiconductor device SD described above is an example. For example, the resin layer RL2 may also be formed of a DAF. In addition, the bonding wires BW may also be provided after mounting the first shield member SIE1. Furthermore, the second shield member SIE2 and the semiconductor chip SC may also be mounted on the wiring board WP after mounting the semiconductor chip SC over the second shield member SIE2. Moreover, the semiconductor chip SC and the first shield member SIE1 may also be mounted over the second shield member SIE2 after mounting the first shield member SIE1 over the semiconductor chip SC.

Next, a description is given to actions and effects of the present embodiment. According to the present embodiment, the magnetic memory cell MR of the semiconductor chip SC is covered with the magnetic shield member SIE. Therefore, the magnetic memory cell MR is protected from an external magnetic field in the vertical direction.

The magnetic shield member SIE is divided into the first shield member SIE1 and the second shield member SIE2. Therefore, the second shield member SIE2 is mounted over the wiring board WP, and furthermore, the semiconductor chip SC is mounted over the second shield member SIE2, followed by mounting the first shield member SIE1 over the semiconductor chip SC, thus the semiconductor chip SC can be covered with the magnetic shield member SIE. Accordingly, compared with a case of not dividing the magnetic shield member SIE into the first shield member SIE1 and the second shield member SIE2, the yield of semiconductor devices SD is increased.

The first shield member SIE1 and the second shield member SIE2 can be formed individually along a first surface and a second surface of the semiconductor chip SC, respectively. Therefore, even in a case where the semiconductor chip SC varies in thickness, the magnetic shield member SIE can be prevented from widely separating from the first surface or the second surface of the semiconductor chip SC.

Between a plane including the first surface of the semiconductor chip SC having the magnetic memory cell MR and a plane including the second surface, a low magnetic resistance portion is formed having the magnetic permeability higher than that of any of the semiconductor chip SC and the sealing resin MO. That is, a portion facing a side of the semiconductor chip SC of the magnetic shield member SIE is provided with the low magnetic resistance portion. In the present embodiment, the low magnetic resistance portion includes the side facing region SP of the first shield member SIE1. In addition, depending on the thickness of the resin layer RL1, a portion of the resin layer RL1 also configures the low magnetic resistance portion. In a case of providing the low magnetic resistance portion, a magnetic field flowing through between the first shield member SIE1 formed on the side of the first surface of the semiconductor chip SC and the second shield member SIE2 formed on the side of the second surface of the semiconductor chip SC preferentially goes through, not the semiconductor chip SC, but the low magnetic resistance portion. Therefore, it is possible to make the magnetic field going through the semiconductor chip SC smaller.

A distance from the low magnetic resistance portion described above to a side of the semiconductor chip SC is smaller than a distance from the low magnetic resistance portion to a side of the sealing resin MO. With this, the magnetic field flowing through between the first shield member SIE1 formed on the side of the first surface of the semiconductor chip SC and the second shield member SIE2 formed on the side of the second surface of the semiconductor chip SC preferentially goes through the low magnetic resistance portion. Therefore, the magnetic field to let the semiconductor chip SC through can further be smaller. It is preferred that the center of the low magnetic resistance portion in a width direction is located closer to the side of the semiconductor chip SC than a center of the distance from a side of the semiconductor chip SC to a side of the sealing resin MO.

In a case of forming the side facing region SP by bending the shield member SIE having a thickness $t_0$, particularly when $t_0$ exceeds ½ of the chip thickness, there are some cases where bending of high mechanical stress results or the bending angle slightly varies due to the spring back phenomenon and the like. In a case of integrally forming the first shield member SIE1 and the second shield member SIE2 via a bending unit, even a slight difference in the angle causes the magnetic shield member SIE to have a shield end on the side opposite to the side facing region SP in a greater distance from the semiconductor chip SC. In this case, there is a risk of decreasing the magnetic shield effect of the magnetic shield member SIE or damaging the semiconductor chip SC when fitting the semiconductor chip SC into the magnetic shield member SIE.

In contrast, in the present embodiment, since the magnetic shield member SIE is divided into the first shield member SIE1 and the second shield member SIE2, it is possible to inhibit occurrence of the problems described above even in a case where at least one of them has a bending unit.

In the present embodiment, the magnetic shield member SIE is sealed within a region surrounded by the wiring board WP and the sealing resin MO and is configured not to be exposed from them. This allows suppression of corrosion of a metal material constituting the shield member and suppression of a change in the magnetic permeability derived from the corrosion product.

(First Modification)

Figure 12:
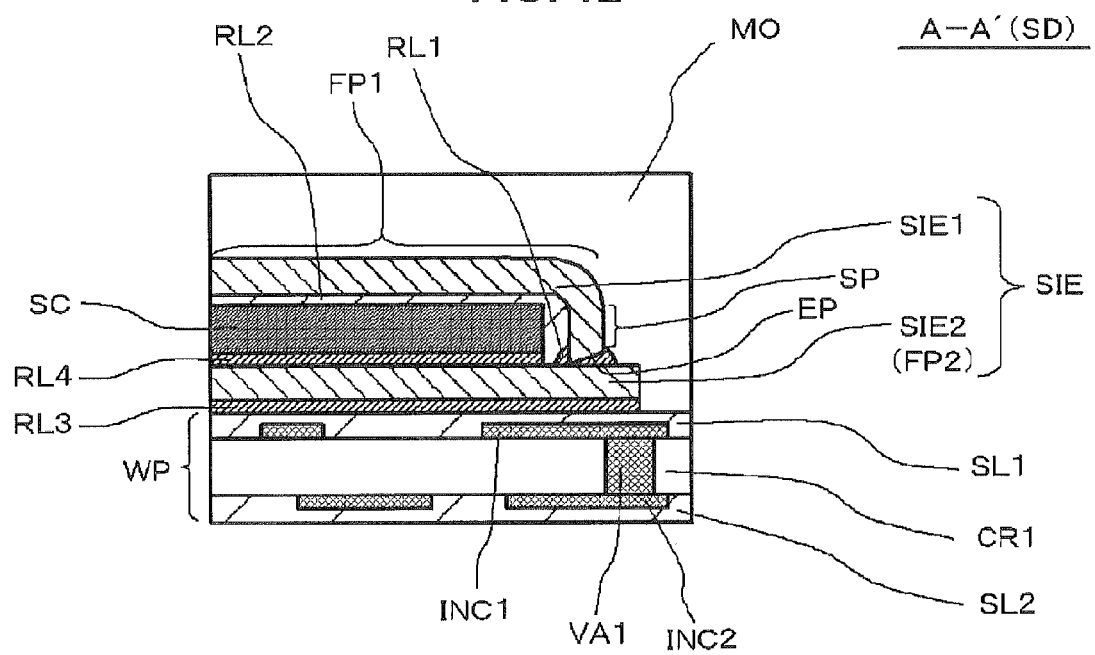
FIG. 12 is a cross-sectional view illustrating a configuration of a semiconductor device according to First Modification.

FIG. 12 is a cross-sectional view illustrating a configuration of a semiconductor device SD according to First Modification. FIG. 12 corresponds to FIG. 3 in the embodiment. The semiconductor device SD according to the present modification has the same configuration as that of the semiconductor device SD according to the embodiment other than the following points.

First, a portion coupling the first facing region FP1 and the side facing region SP of the first shield member SIE1 is curved. In addition, an end face EP of the side facing region SP is inclined. In detail, the end face EP is inclined in such a manner that an end of the surface on the side closer to the semiconductor chip SC among the surfaces of the first shield member SIE1 becomes close to the second shield member SIE2 more than the end of the surface on the side away from the semiconductor chip SC. Such shape can be achieved by bending a thin plate containing, for example, a soft magnetic material and further by adjusting the conditions at that time.

Also in the present modification, the same effect as that in the embodiment can also be obtained. Furthermore, the end face EP of the side facing region SP is inclined relative to the second facing region FP2 of the second shield member SIE2. Therefore, the end face EP gets easily pushed into the resin layer RL1, and as a result, the end face EP comes easily in contact with the second shield member SIE2. When the end face EP comes in contact with the second shield member SIE2, the magnetic resistance in the coupling portion of the first shield member SIE1 and the second shield member SIE2 becomes less, and thus the magnetic flux content leaking when conducted from the end face EP to the second shield member SIE2 can be made less. This allows protection of the magnetic memory cell MR (refer to FIGS. 2A and 2B) from the magnetic field through the use of the magnetic shield member SIE even when a large magnetic field occurs near the semiconductor chip SC.

(Second Modification)

Figure 13:
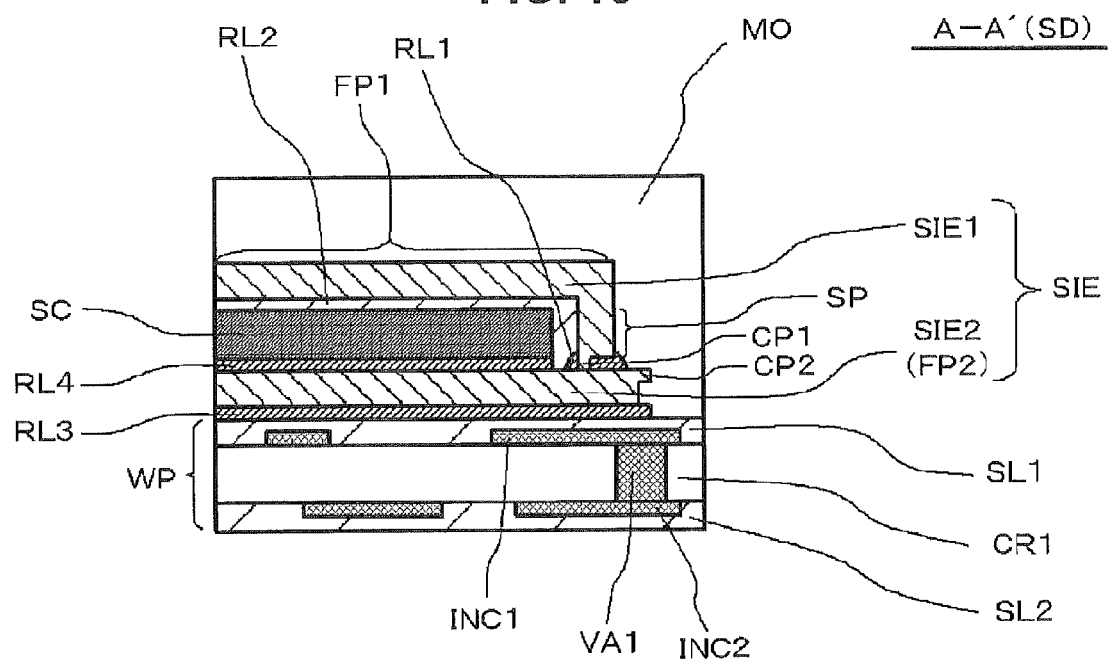
FIG. 13 is a cross-sectional view illustrating a configuration of a semiconductor device according to Second Modification.

FIG. 13 is a cross-sectional view illustrating a configuration of a semiconductor device SD according to Second Modification. FIG. 13 corresponds to FIG. 3 in the embodiment. The semiconductor device SD according to the present modification has the same configuration as that of the semiconductor device SD according to the embodiment other than the following points.

First, the end face EP of the side facing region SP of the first shield member SIE1 has a convex portion CP1. The end face EP of the second shield member SIE2 has a convex portion CP2. The center of the convex portion CP1, that is, the end of the first shield member SIE1 is located closer to the semiconductor chip SC (that is, left in FIG. 13) than the center of the thickness of the side facing region SP. The entire surface of the end face of the first shield member SIE1, including the convex portion CP1, is covered with the resin layer RL1. The center of the convex portion CP2 is located closer to a surface having the semiconductor chip SC mounted thereover (that is, top in FIG. 13) than the center of the thickness of the second shield member SIE2.

The convex portion CP1 and the convex portion CP2 according to the present modification can be manufactured, for example, as follows. First, a first groove is formed in a thin plate containing a soft magnetic material. This groove is formed using, for example, a dicing blade. Subsequently, a second groove having a width narrower than that of the first groove is formed in the bottom of the first groove. The second groove penetrates the thin plate. The second groove is also formed using, for example, a dicing blade. Then, the thin plate is subjected to bending. Similar to First Modification, the coupling portion of the first facing region FP1 and the side facing region SP in the first shield member SIE1 may also be curved.

Also in the present modification, it is possible to obtain the same effects as those in First Modification. In addition, since the end face of the first shield member SIE1 is provided with the convex portion CP1, the magnetic flux flowing in the first shield member SIE1 not easily leaks outside when conducted to the second shield member SIE2. Accordingly, the shielding effect of the magnetic shield member SIE is enhanced.

The second shield member SIE2 is provided with the convex portion CP2. The convex portion CP2 is located closer to a surface having the semiconductor chip SC mounted thereon than the center of the thickness of the second shield member SIE2. Therefore, the magnetic flux that did not enter (leaked from) the first shield member SIE1 easily enters the second shield member SIE2. Accordingly, the shielding effect of the magnetic shield member SIE is enhanced.

(Third Modification)

Figure 14:
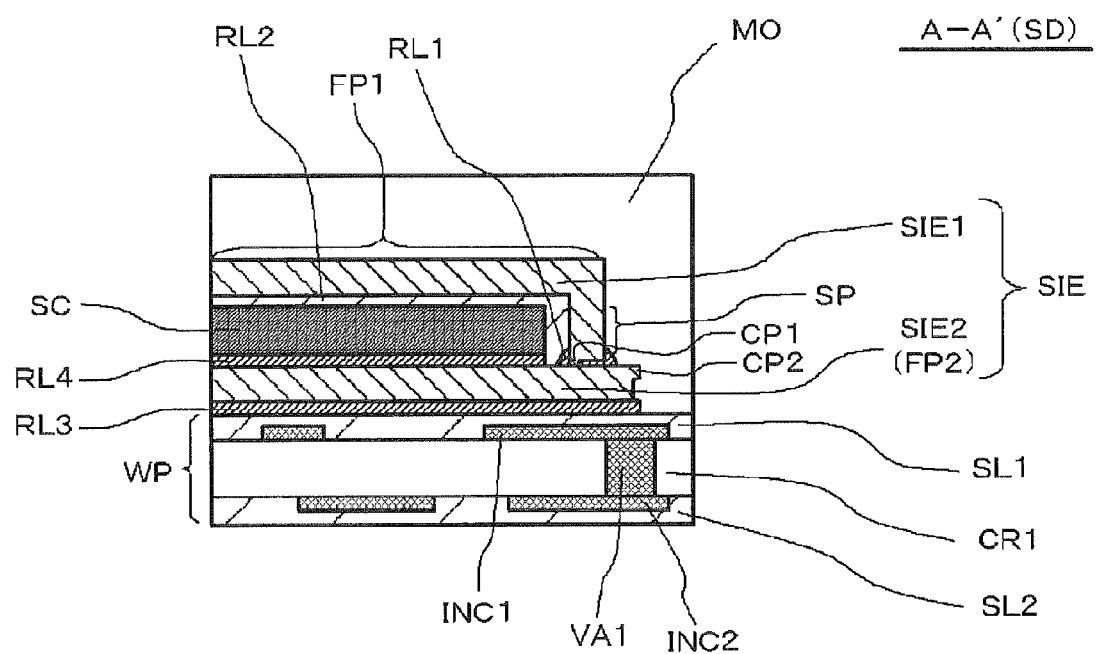
FIG. 14 is a cross-sectional view illustrating a configuration of a semiconductor device according to Third Modification.

FIG. 14 is a cross-sectional view illustrating a configuration of a semiconductor device SD according to Third Modification. FIG. 14 corresponds to FIG. 3 in the embodiment. The semiconductor device SD according to the present modification has the same configuration as that of the semiconductor device SD according to Second Modification other than a method of manufacturing a convex portion CP1 and a convex portion CP2.

In the present embodiment, an end face of the first shield member SIE1 is punched in a direction from the surface on the side opposite to the convex portion CP1, towards the surface with the convex portion CP1 formed therein. In a case of punching, a terminal portion of the shear surface in the punching direction is increased in thickness, and thus the convex portion CP1 and the convex portion CP2 are formed when punched. Note that, in a case of forming a convex portion CP1 and a convex portion CP2 in the present method, the surfaces of the convex portion CP1 and the convex portion CP2 become coarse.

Also according to the present embodiment, it is possible to obtain the same effects as those in Second Modification. In addition, since the convex portion CP1 and the convex portion CP2 can be formed by punching process, the manufacturing cost of a magnetic shield member SIE can be reduced.

(Fourth Modification)

Figure 15:
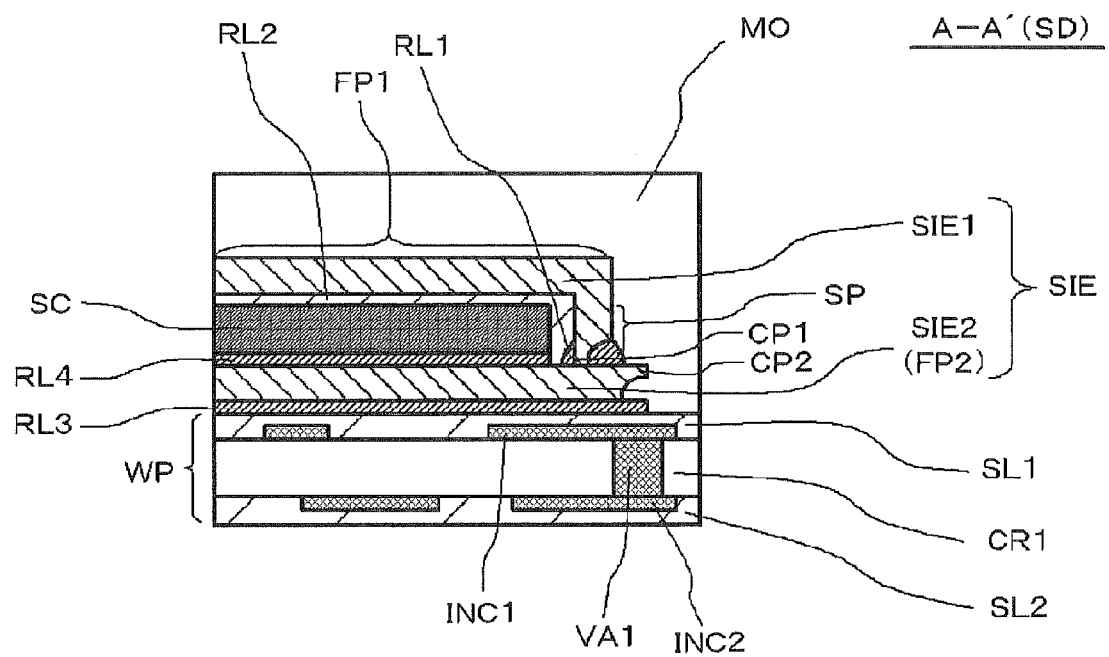
FIG. 15 is a cross-sectional view illustrating a configuration of a semiconductor device according to Fourth Modification.

FIG. 15 is a cross-sectional view illustrating a configuration of a semiconductor device SD according to Fourth Modification. FIG. 15 corresponds to FIG. 3 in the embodiment. The semiconductor device SD according to the present modification has the same configuration as that of the semiconductor device SD according to Second Modification other than a method of manufacturing a convex portion CP1 and a convex portion CP2.

In the present embodiment, the convex portion CP1 of the first shield member SIE1 and the convex portion CP2 of the second shield member SIE2 are formed by etching. In detail, an outer surface of the side facing region SP of the first shield member SIE1 has an end portion subjected to half etching. In addition, a surface facing the wiring board WP of the second shield member SIE2 has an end portion subjected to half etching. Therefore, the surface on the side opposite to the semiconductor chip SC in the convex portion CP1 and the surface facing the wiring board WP in the convex portion CP2 are curved surfaces.

Figure 16A:
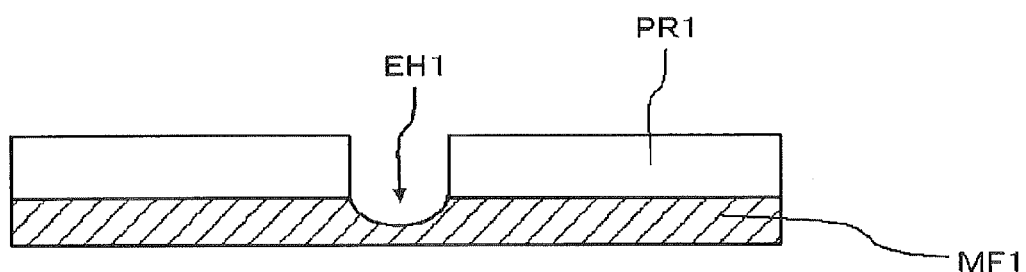
FIGS. 16A and 16B are cross-sectional views illustrating First Example of a method of manufacturing a convex portion.
Figure 16B:
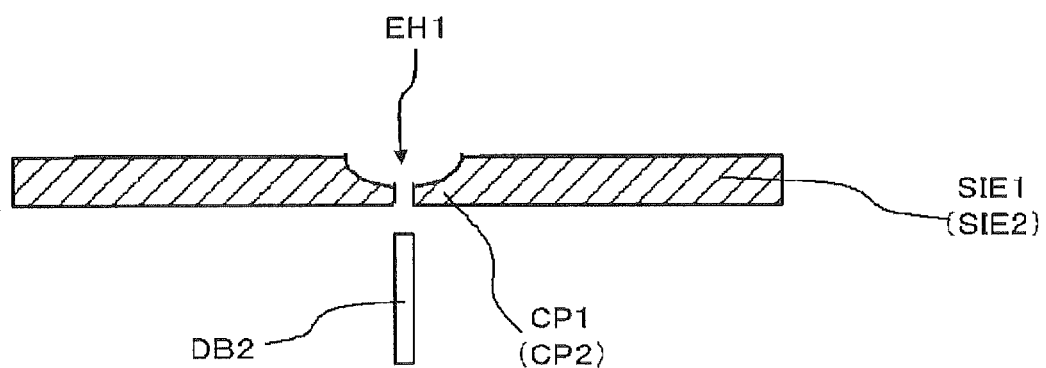

FIGS. 16A and 16B are cross-sectional views illustrating First Example of a method of manufacturing a convex portion CP1 and a convex portion CP2 according to the present modification. First, as illustrated in FIG. 16A, a soft magnetic film MF1 is prepared. Next, a resist pattern PR1 is formed over one surface of the soft magnetic film MF1. Subsequently, by using the resist pattern PR1 as a mask, the soft magnetic film MF1 is half etched. With this, a concave portion EH1 is formed in the one surface of the soft magnetic film MF1.

After that, as illustrated in FIG. 16B, the resist pattern PR1 is removed. Subsequently, by using, for example, a dicing blade DB2, a penetrating groove is formed in a bottom of the concave portion EH1. With this, the convex portion CP1 (or the convex portion CP2) is formed in the first shield member SIE1 (or the second shield member SIE2).

Figure 17:
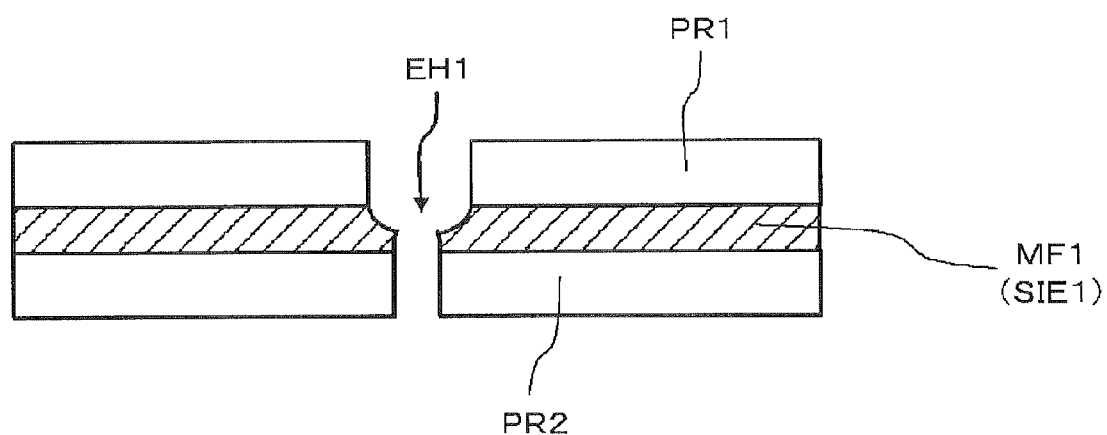
FIG. 17 is a cross-sectional view illustrating Second Example of a method of manufacturing a convex portion.

FIG. 17 is a cross-sectional view illustrating Second Example of a method of manufacturing a convex portion CP1 and a convex portion CP2 according to the present modification. A concave portion EH1 is formed in one surface of a soft magnetic film MF1. A method of forming the concave portion EH1 is the same as that of First Example illustrated in FIGS. 16A and 16B. Next, while leaving the resist pattern PR1, a resist pattern PR2 is formed on a surface not having the concave portion EH1 formed in the soft magnetic film MF1. Subsequently, by using the resist pattern PR2, the soft magnetic film MF1 is etched. With this, a penetrating groove is formed in a bottom of the concave portion EH1. With this, the convex portion CP1 (or the convex portion CP2) is formed in the first shield member SIE1 (or the second shield member SIE2).

Also according to the present embodiment, it is possible to obtain the same effects as those in Second Modification. In addition, since the convex portion CP1 and the convex portion CP2 can be formed by etching, the respective convex portions CP1 and the respective convex portions CP2 can be formed at the same time in a plurality of first shield members SIE1 (or second shield members SIE2). Accordingly, the manufacturing cost of a magnetic shield member SIE can be reduced.

(Fifth Modification)

Figure 18:
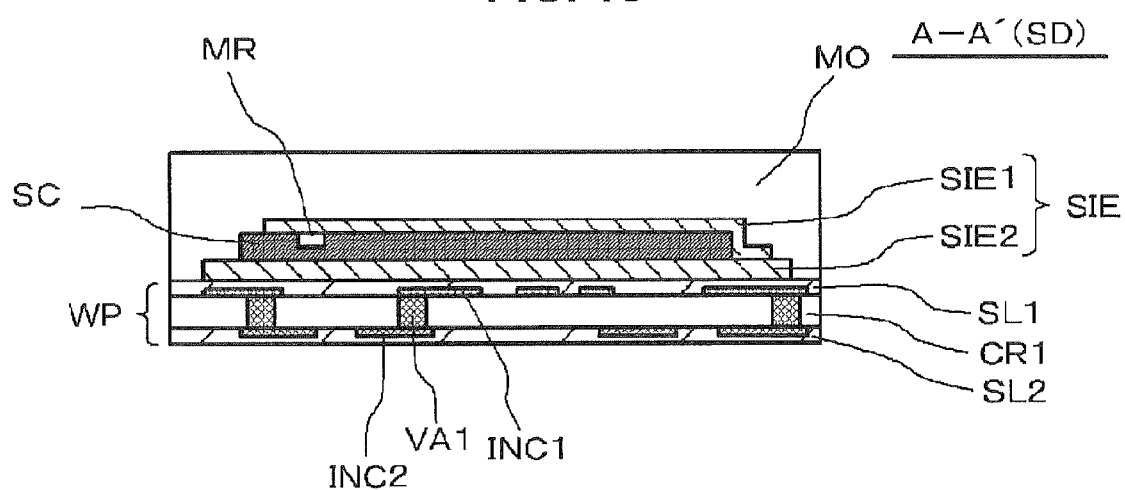
FIG. 18 is a cross-sectional view illustrating a configuration of a semiconductor device according to Fifth Modification.
Figure 19:
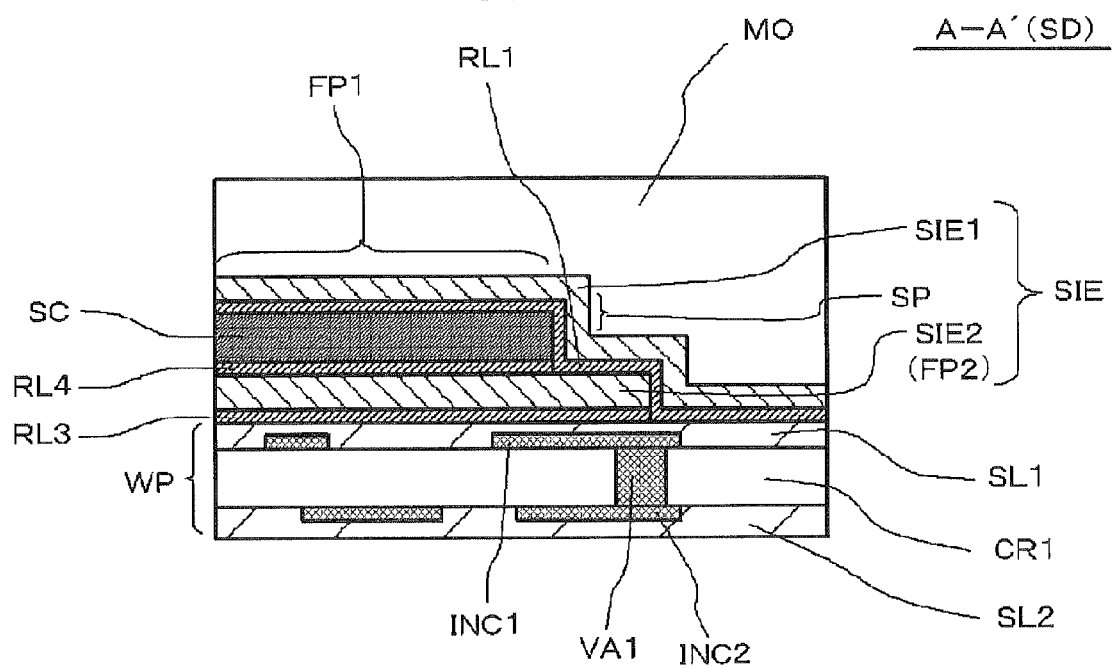
FIG. 19 is a cross-sectional view illustrating a configuration of the semiconductor device according to Fifth Modification.

FIGS. 18 and 19 are cross-sectional views illustrating a configuration of a semiconductor device SD according to Fifth Modification. FIG. 18 corresponds to FIG. 2A in the embodiment, and FIG. 19 corresponds to FIG. 3 in the embodiment. The semiconductor device SD according to the present modification has the same configuration as that of the semiconductor device SD according to the embodiment other than a configuration of a magnetic shield member SIE.

In the present modification, an end portion of the first shield member SIE1 extends through an active surface and a side of the semiconductor chip SC to a surface facing the semiconductor chip SC in the second shield member SIE2. The first shield member SIE1 is a tape material (for example, a permalloy tape) in which, for example, the back surface of the soft magnetic material layer is provided with the resin layer RL1. The resin layer RL1 according to the present modification is an adhesive layer. In the example illustrated in FIGS. 18 and 19, the end face of the first shield member SIE1 is located inside the sealing resin MO as illustrated in FIG. 18.

The semiconductor device SD according to the present modification is formed as follows. First, the second shield member SIE2 and the semiconductor chip SC are mounted over the wiring board WP. These steps are the same as those in the embodiment. Next, the first shield member SIE1 is attached over the active surface SC and along the side of the semiconductor chip, and an end portion thereof is attached over the second shield member SIE2. After that, the sealing resin MO is formed.

Figure 20:
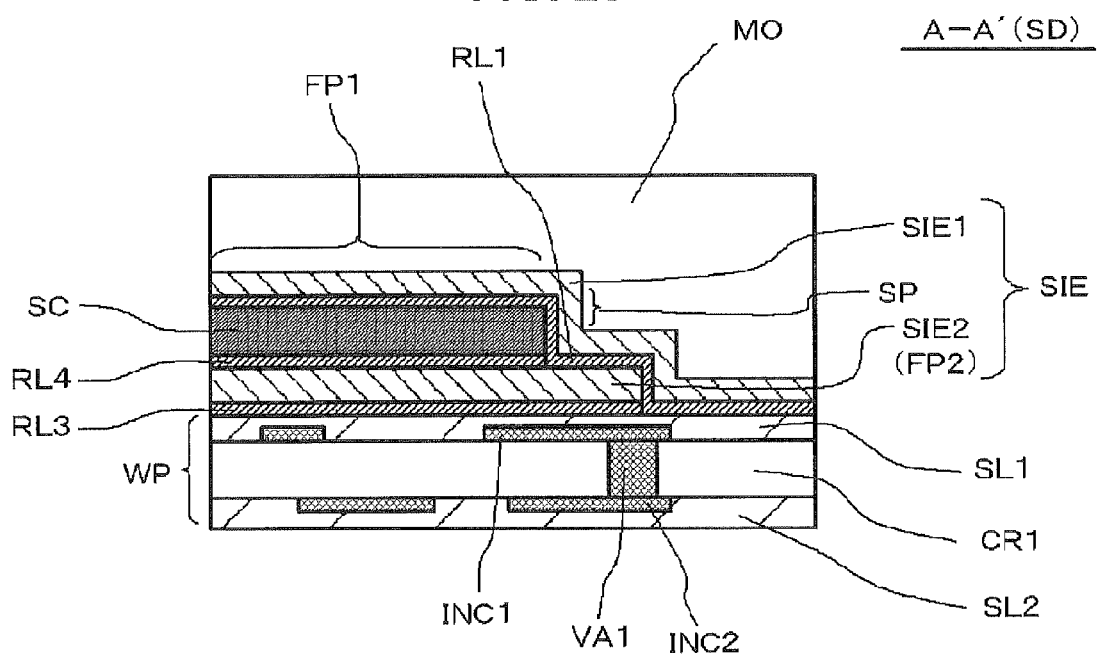
FIG. 20 is a cross-sectional view illustrating a configuration of the semiconductor device according to Fifth Modification.
Figure 21:
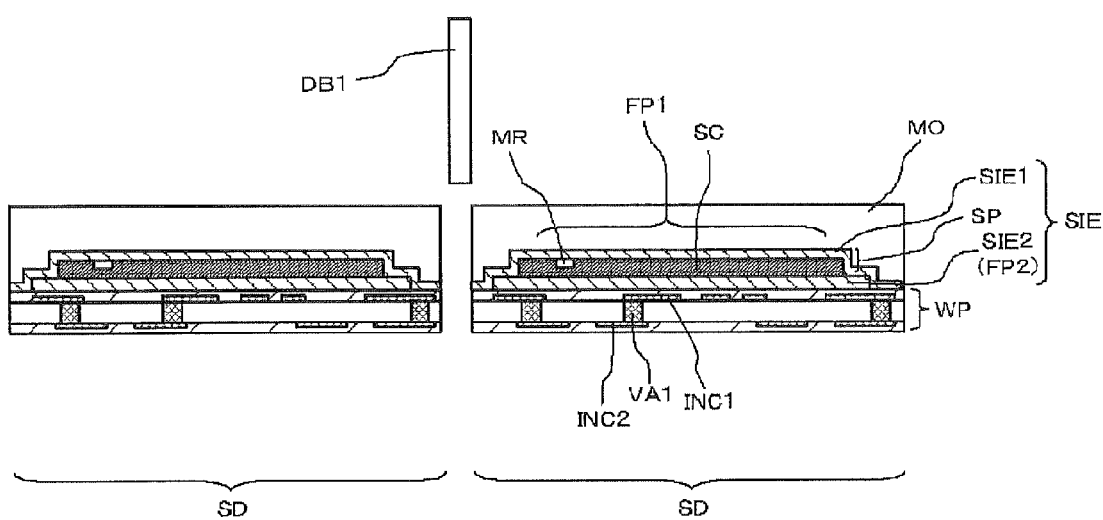
FIG. 21 is a cross-sectional view illustrating a method of manufacturing a semiconductor device according to Fifth Modification.

Meanwhile, as illustrated in FIG. 20, the first shield member SIE1 may also extend further to the wiring board WP through the side of the second shield member SIE2 for an end portion thereof to form an identical surface with the end face of the sealing resin MO and the end face of the wiring board WP. In this case, the semiconductor device SD is formed as follows. First, in a state where a plurality of wiring boards WP are linked with each other, a semiconductor chip SC and a second shield member SIE2 are mounted over each of the wiring boards WP. Next, one sheet of a tape material is attached over the semiconductor chips SC and over the second shield members SIE2. Subsequently, as illustrated in FIG. 21, a sealing resin MO is formed, and the sealing resin MO, the first shield member SIE1, and the wiring board WP are cut using, for example, a dicing blade DB1.

Also according to the present modification, it is possible to obtain the same effects as those in the embodiment. In addition, since the first shield member SIE1 can be formed using a tape material, for example, a permalloy tape, the manufacturing cost of a magnetic shield member SIE can be reduced.

Furthermore, in a case where the first shield member SIE1 has a structure illustrated in FIG. 20, the first shield members SIE1 can be mounted in an identical step, and thus the manufacturing cost of a magnetic shield member SIE can further be reduced.

Figure 22:
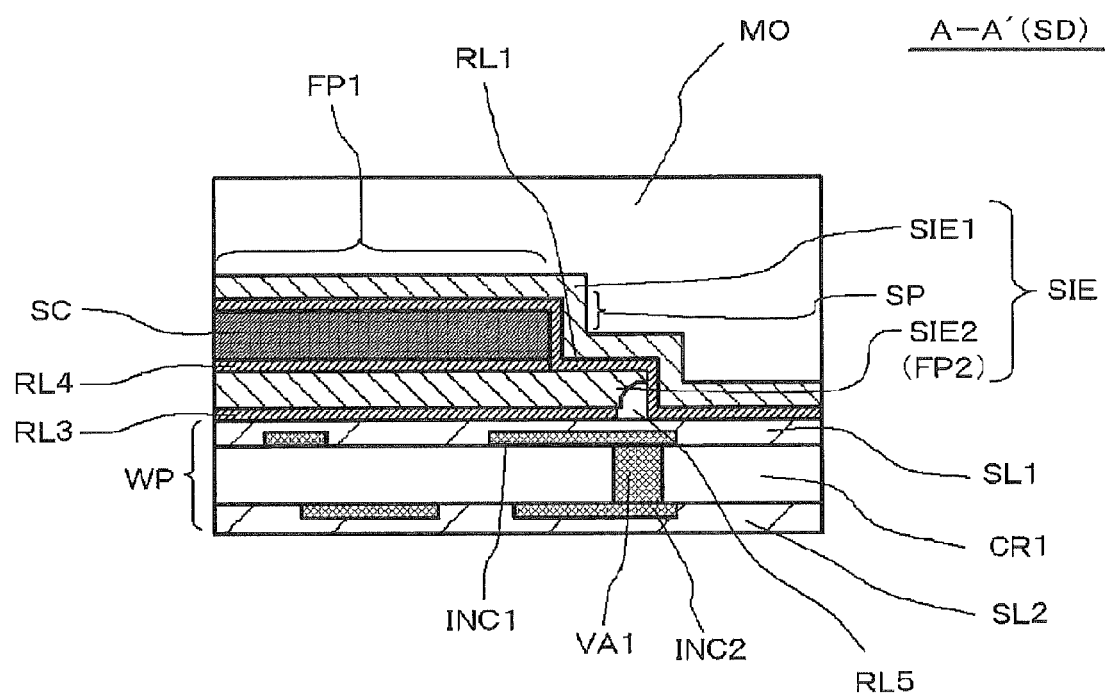
FIG. 22 is a cross-sectional view illustrating a configuration of a semiconductor device according to Fifth Modification.

In the semiconductor device SD according to First to Fifth Modifications, the first shield member SIE1 may also have the structure of the present modification. For example, in the example illustrated in FIG. 22, the second shield member SIE2 has the structure shown in Fourth Modification. Then, a resin layer RL5 is filled in a space between a lower part of the convex portion CP2 and the wiring board WP.

(Sixth Modification)

Figure 23:
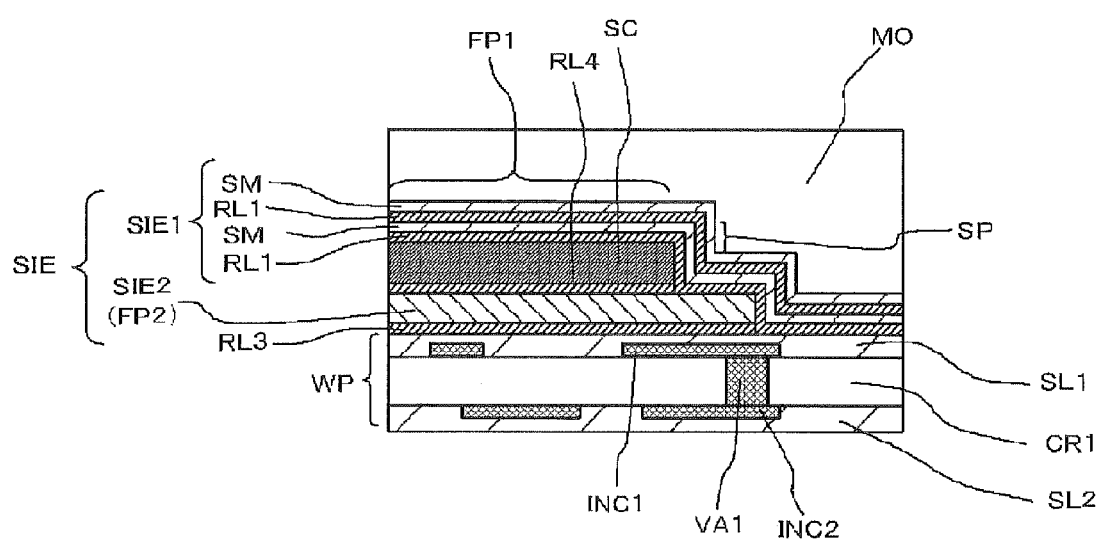
FIG. 23 is a cross-sectional view illustrating a configuration of a semiconductor device according to Sixth Modification.

FIG. 23 is a cross-sectional view illustrating a configuration of a semiconductor device SD according to Sixth Modification. FIG. 23 corresponds to FIG. 3 in the embodiment. The semiconductor device SD according to the present modification has the same configuration as that of the semiconductor device SD according to Fifth Modification other than a structure of a sealing material configuring a first shield member SIE1. Meanwhile, while an end portion of the first shield member SIE1 in FIG. 23 has the same structure as that in FIG. 20, it may also be the same structure as that in FIG. 19.

In the present embodiment, the first shield member SIE1 has a structure of repeatedly laminating a resin layer RL1 and a soft magnetic layer SM in a plurality of times. While each two layers of resin layer RL1 and soft magnetic layer SM are provided in the example illustrated in FIG. 23, each three or more layers of them may also be provided.

Also in the present modification, it is possible to obtain the same effects as those in Fifth Modification. In addition, since the first shield member SIE1 has the structure of repeatedly laminating the resin layer RL1 and the soft magnetic layer SM, the magnetic shield member SIE can have a larger saturation magnetic flux content.

(Seventh Modification)

Figure 24:
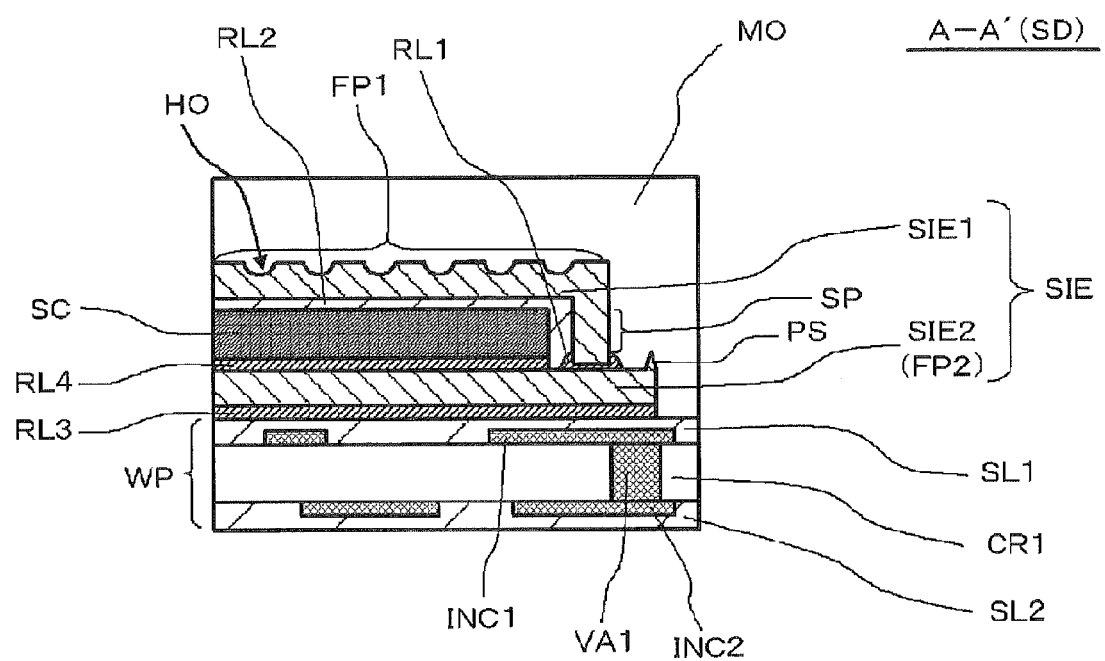
FIG. 24 is a cross-sectional view illustrating a configuration of a semiconductor device according to Seventh Modification.

FIG. 24 is a cross-sectional view illustrating a configuration of a semiconductor device SD according to Seventh Modification. The semiconductor device SD according to the present modification has the same configuration as that of the semiconductor device SD according to the embodiment or First to Sixth Modifications. FIG. 24 illustrates the same case as the embodiment.

First, the surface making contact with the sealing resin MO in the first shield member SIE1 has a plurality of concave portions HO. The concave portions HO are formed by, for example, pressing or etching.

The second shield member SIE2 has an end portion with a convex portion PS formed therein. The convex portion PS is formed in a surface facing the semiconductor chip SC in the second shield member SIE2, and gets in the sealing resin MO. The convex portion PS is formed when forming an end face of the second shield member SIE2 by, for example, shearing a soft magnetic board from the bottom towards the top in FIG. 24.

Also according to the present modification, it is possible to obtain the same effects as those in the embodiment or First to Sixth Modifications. In addition, since the first shield member SIE1 has the plurality of concave portions HO formed therein, the adhesion of the first shield member SIE1 and the sealing resin MO can be enhanced. Still in addition, since the second shield member SIE2 has the convex portion PS formed therein, the shielding effect of the magnetic shield member SIE can be enhanced due to the action similar to the convex portion CP2 in Second Modification.

(Eighth Modification)

Figure 25:
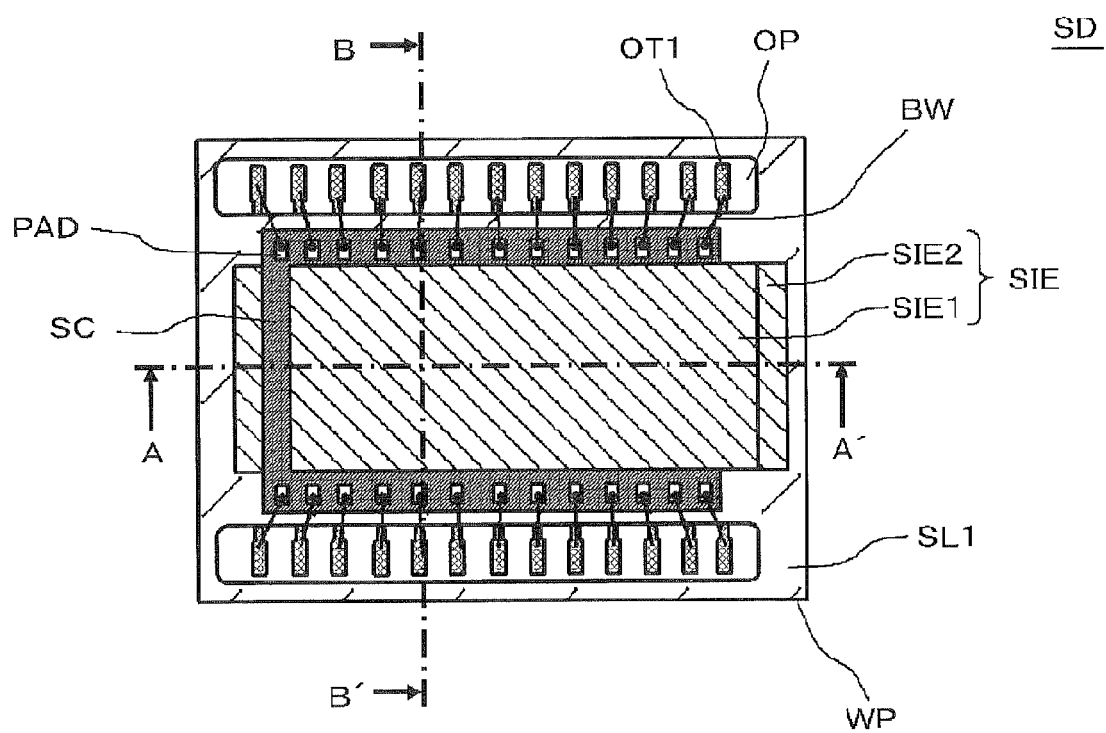
FIG. 25 is a plan view illustrating a configuration of a semiconductor device according to Eighth Modification.
Figure 26:
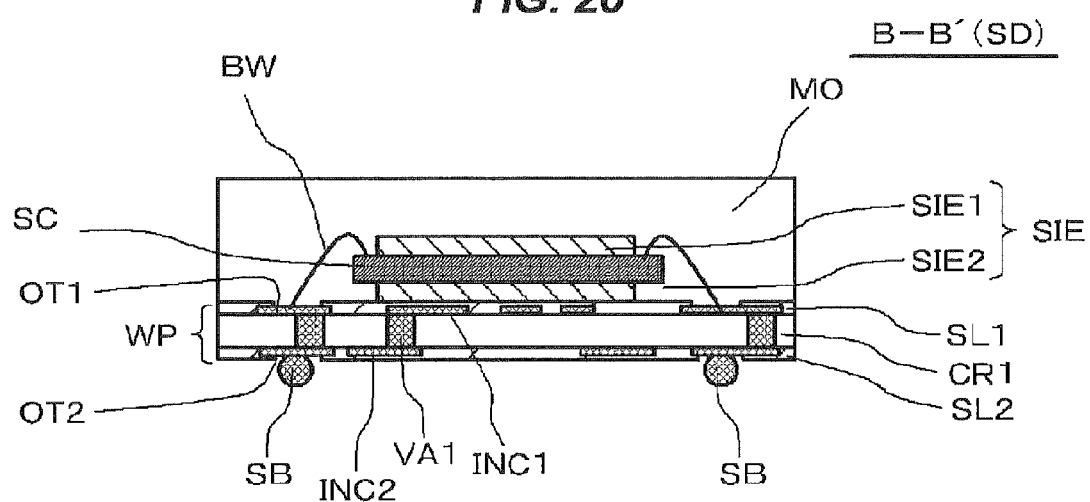
FIG. 26 is a B-B' cross-sectional view of FIG. 25.

FIG. 25 is a plan view illustrating a configuration of a semiconductor device SD according to Eighth Modification. FIG. 26 is a B-B' cross-sectional view of FIG. 25. The semiconductor device SD according to the present modification has the same configuration as that of any of the embodiment or First to Seventh Modifications other than that a width in a direction perpendicular to an alignment of electrode pads PAD in a second shield member SIE2 (vertical length in FIG. 25) is narrower than a width of a semiconductor chip SC.

In the example illustrated in FIGS. 25 and 26, the second shield member SIE2 has a width, approximately the same as the width of the first shield member SIE1. However, the second shield member SIE2 may also have a width narrower or larger than the width of the first shield member SIE1.

Also according to the present modification, it is possible to obtain the same effects as those in any of the embodiment or First to Seventh Modifications. In addition, in plan view, the second shield member SIE2 has the width in the direction perpendicular to the alignment of the electrode pads PAD narrower than the width of the semiconductor chip SC. Therefore, the bonding wires BW and the second shield member SIE2 can be prevented from interference.

In a case where the second shield member SIE2 is unnecessarily large, an amount of magnetic flux concentrated on the magnetic shield member SIE becomes greater. In this case, there is a possibility that a magnetic flux content per unit area (magnetic flux density) flowing in the magnetic shield member SIE exceeds a saturation magnetic flux density $\phi_{th}$ derived from the material. When the magnetic flux is induced into the magnetic shield member SIE by an external magnetic field, the magnetic field turns out to leak inside the magnetic shield member SIE (that is, the magnetic memory cell MR of the semiconductor chip SC) as the magnetic flux density exceeds the saturation magnetic flux density $\phi_{th}$ (magnetic flux saturation phenomena). In contrast, in the present embodiment, the area of the second shield member SIE2 can be made smaller. Accordingly, the magnetic flux saturation phenomena can be inhibited, and thus the magnetic memory cell MR can be protected from a greater external magnetic field.

(Ninth Modification)

Figure 27:
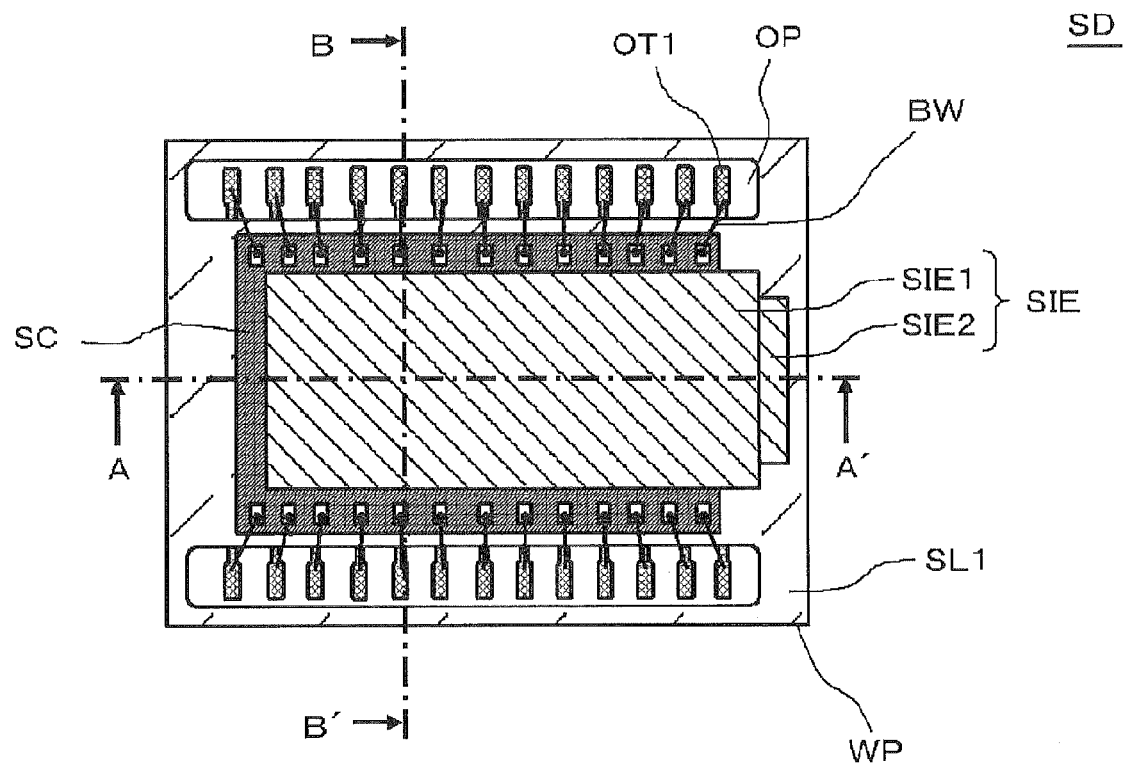
FIG. 27 is a plan view illustrating a configuration of a semiconductor device according to Ninth Modification.
Figure 28A:
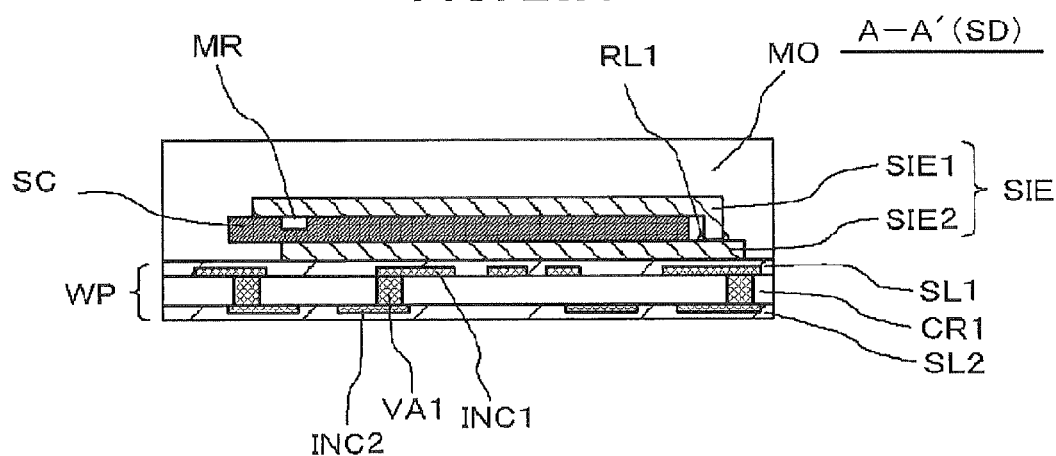
FIG. 28A is an A-A' cross-sectional view of FIG. 27
Figure 28B:
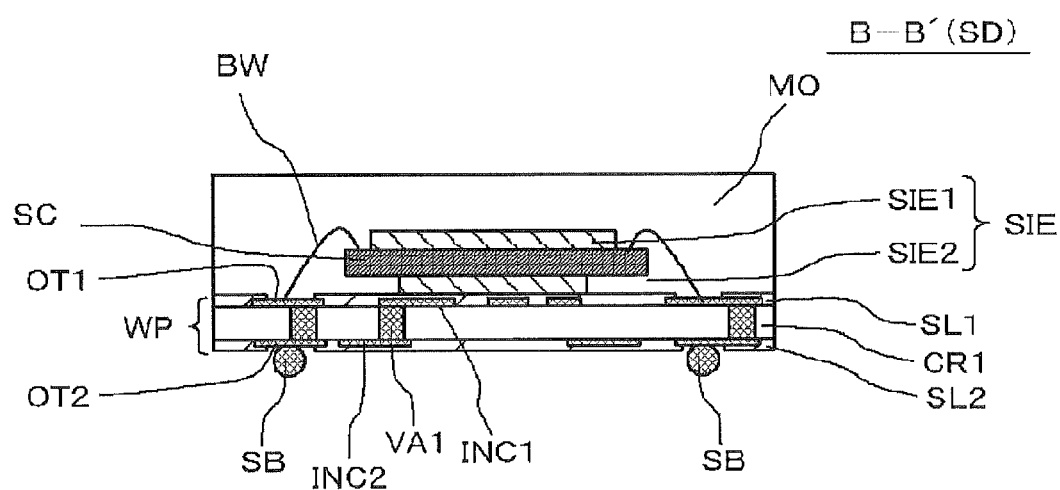
FIG. 28B is a B-B' cross-sectional view of FIG. 27.

FIG. 27 is a plan view illustrating a configuration of a semiconductor device SD according to Ninth Modification. FIG. 28A is an A-A' cross-sectional view of FIG. 27 and FIG. 28B is a B-B' cross-sectional view of FIG. 27. The semiconductor device SD according to the present modification has the same configuration as that of Eighth Modification other than that an end portion of the side not linked with the first shield member SIE1 among the end portions of the second shield member SIE2 (an end portion on the left in FIGS. 27 and 28A) is located between the semiconductor chip SC and the wiring board WP. In the example illustrated in FIGS. 27 and 28A, the second shield member SIE2 has a width narrower than the width of the first shield member SIE1.

Also according to the present modification, it is possible to obtain the same effects as those in Eighth Modification. In addition, since the area of the second shield member SIE2 can further be made smaller, the magnetic flux content concentrated by the magnetic shield member SIE can be reduced, and thus the magnetic flux saturation phenomena can be inhibited.

(Tenth Modification)

Figure 29:
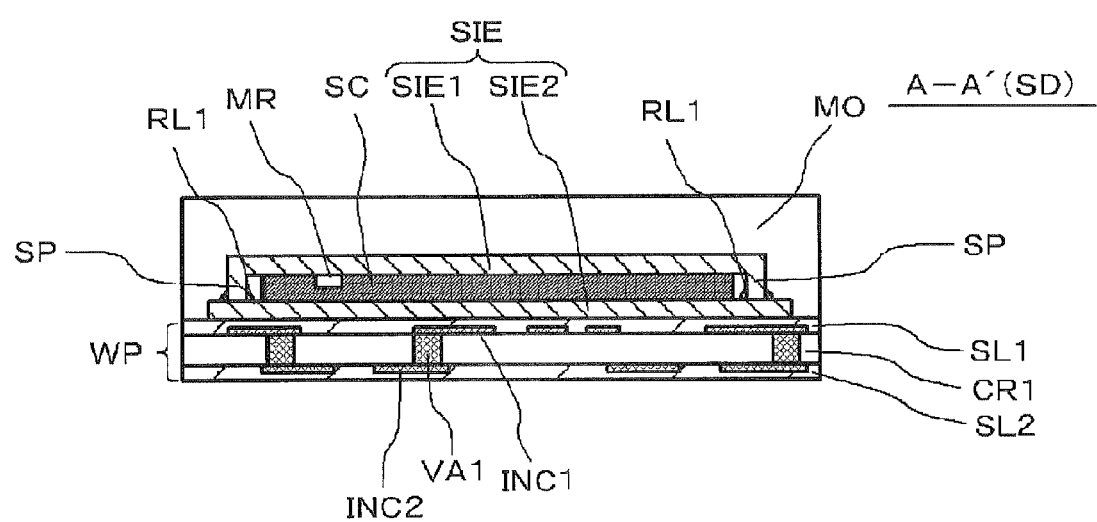
FIG. 29 is a cross-sectional view illustrating a configuration of a semiconductor device according to Tenth Modification.

FIG. 29 is a cross-sectional view illustrating a configuration of a semiconductor device SD according to Tenth Modification. FIG. 29 corresponds to FIG. 2A in the embodiment. The semiconductor device SD according to the present modification is the same as the embodiment or First to Eighth Modifications other than that a side facing region SP is formed in each of two sides of the first shield member SIE1 facing each other.

Also according to the present modification, it is possible to obtain the same effects as those of any of the embodiment or First to Eighth Modifications. In addition, the two areas of the first shield member SIE1 are provided with the respective side facing regions SP. An area likely to have a highest magnetic flux density in the magnetic shield member SIE is the coupling portion of the first shield member SIE1 and the second shield member SIE2. In the present modification, since the area of coupling the first shield member SIE1 and the second shield member SIE2 can be made larger, the magnetic shield member SIE becomes not easily magnetic flux-saturated. Accordingly, the magnetic memory cell MR can be protected from a greater external magnetic field.

(Eleventh Modification)

Figure 30:
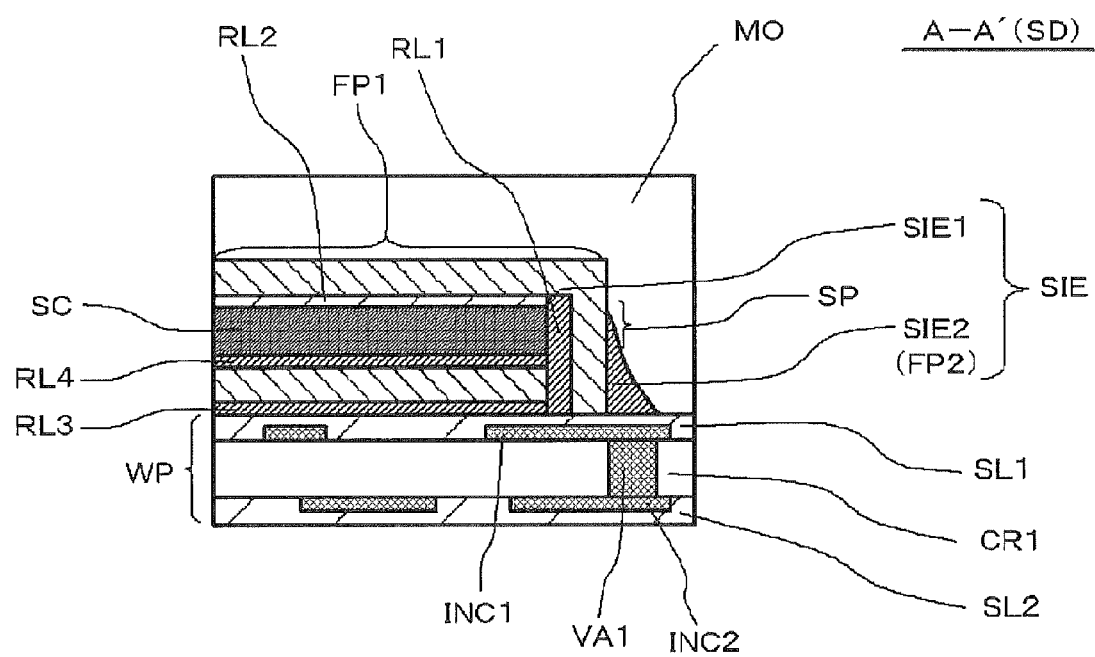
FIG. 30 is a cross-sectional view illustrating a configuration of a semiconductor device according to Eleventh Modification.

FIG. 30 is a cross-sectional view illustrating a configuration of a semiconductor device SD according to Eleventh Modification. FIG. 30 corresponds to FIG. 3 in the embodiment. The semiconductor device SD according to the present modification has the same configuration as that of the embodiment or First to Tenth Modifications other than the following points.

First, a second shield member SIE2 has a planar shape identical to a planar shape of a semiconductor chip SC. Then, a resin layer RL1 fills a space between a side facing region SP and the semiconductor chip SC. Furthermore, a large fillet of the resin layer RL1 is formed on a side of the side facing region SP.

In the present embodiment, the second shield member SIE2 is attached to the semiconductor chip SC in advance. Specifically, the second shield member SIE2 is attached to the semiconductor chip SC in a wafer state. After that, the semiconductor chip SC and the second shield member SIE2 are singulated into individual parts.

Also according to the present modification, it is possible to obtain the same effects as those in the embodiment. In addition, since the second shield member SIE2 can be placed in a plurality of semiconductor chips SC at the same time, the manufacturing cost of a semiconductor device SD are reduced.

(Twelfth Modification)

Figure 31:
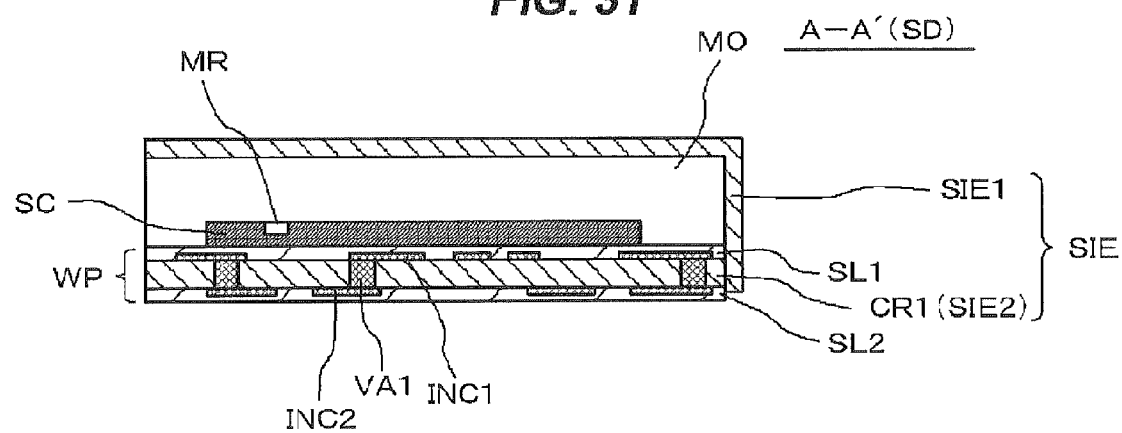
FIG. 31 is a cross-sectional view illustrating a configuration of a semiconductor device according to Twelfth Modification.
Figure 32:
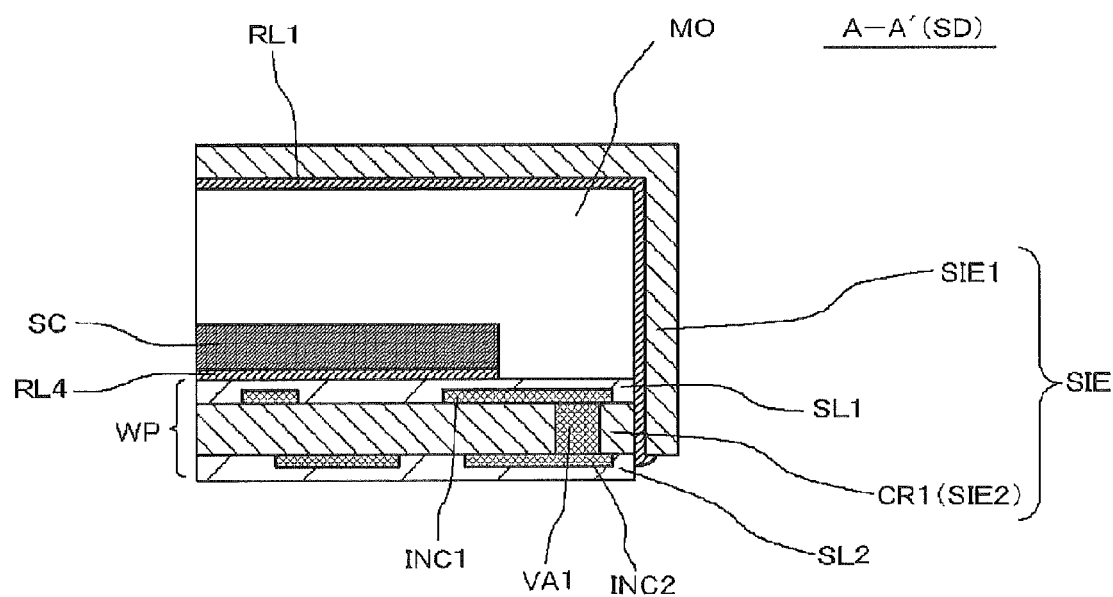
FIG. 32 is an enlarged view of the principal parts of FIG. 31.

FIG. 31 is a cross-sectional view illustrating a configuration of a semiconductor device SD according to Twelfth Modification. FIG. 32 is an enlarged view of the principal parts of FIG. 31. FIG. 31 corresponds to FIG. 2A in the embodiment, and FIG. 32 corresponds to FIG. 3 in the embodiment. The semiconductor device SD according to the present modification has the same configuration as that of the semiconductor device SD according to the embodiment other than the following points.

First, a core layer CR1 of a wiring board WP is formed of a soft insulating material. That is, the core layer CR1 also serves as a second shield member SIE2. The core layer CR1 has end faces not covered with the sealing resin MO. An insulating layer insulates between the core layer CR1 and the via hole VA1.

Then, the first shield member SIE1 extends from a top of the sealing resin MO through a side of the sealing resin MO to an end face of the wiring board WP. The first shield member SIE1 is coupled to the sealing resin MO and the wiring board WP via the resin layer RL1. That is, the first shield member SIE1 is coupled to the core layer CR1 via the resin layer RL1 in the end face of the wiring board WP.

Also in the present modification, it is possible to obtain the same effects as those in the embodiment. In addition, since the second shield member SIE2 can also serve as a core layer CR1, the manufacturing cost of a semiconductor device SD can be reduced.

(Thirteenth Modification)

Figure 33:
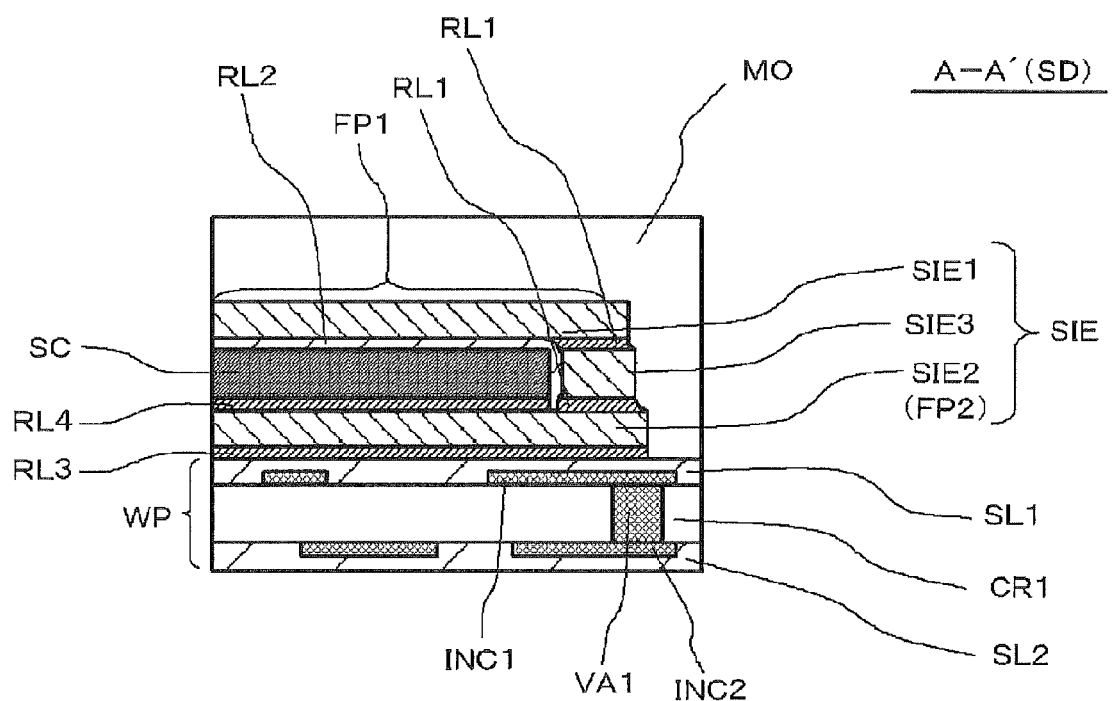
FIG. 33 is a cross-sectional view illustrating a configuration of a semiconductor device according to Thirteenth Modification.

FIG. 33 is a cross-sectional view illustrating a configuration of a semiconductor device SD according to Thirteenth Modification. FIG. 33 corresponds to FIG. 3 in the embodiment. The semiconductor device SD according to the present modification has the same configuration as that of the semiconductor device SD according to the embodiment, Seventh Modification, or Eighth Modification other than the following points.

First, the first shield member SIE1 does not have a side facing region SP. Instead, the magnetic shield member SIE has a third shield member SIE3. The third shield member SIE3 faces a side of the semiconductor chip SC. Then, a resin layer RL1 is located both between the third shield member SIE3 and the first shield member SIE1 and between the second shield member SIE2 and the third shield member SIE3. In the present embodiment, a low magnetic resistance portion includes the third shield member SIE3. Depending on the thicknesses of the resin layers RL1, the resin layers RL1 also configure apart of the low magnetic resistance portion.

In detail, the first facing region FP1 of the first shield member SIE1 extends from above the semiconductor chip SC to above the third shield member SIE3. The second facing region FP2 of the second shield member SIE2 also extends from below the semiconductor chip SC to below the third shield member SIE3. Then, a surface facing the first shield member SIE1 in the third shield member SIE3 is fixed to the first shield member SIE1 by the resin layer RL1. A surface facing the second shield member SIE2 in the third shield member SIE3 is also fixed to the second shield member SIE2 by the resin layer RL1.

When viewed from a surface parallel to the first facing region FP1 of the first shield member SIE1, the third shield member SIE3 has a width larger than the height of the third shield member SIE3. The third shield member SIE3 also has a width larger than the thickness of the first shield member SIE1. The third shield member SIE3 also has a width larger than the thickness of the second shield member SIE2.

The third shield member SIE3 may be formed of a material identical to those of the first shield member SIE1 and the second shield member SIE2, and may also be formed of a different material. In the latter case, the third shield member SIE3 may also be formed of a material having a saturation magnetic flux density higher than those of the first shield member SIE1 and the second shield member SIE2. For example, the first shield member SIE1 and the second shield member SIE2 may be of silicon steel and the third shield member SIE3 may be of permalloy.

The semiconductor device SD according to the present embodiment is manufactured as follows. First, the second shield member SIE2 and the semiconductor chip SC are fixed over the wiring board WP. Next, the third shield member SIE3 is fixed over the second shield member SIE2. Then, the first shield member SIE1 is fixed over the semiconductor device SD and the third shield member SIE3. Subsequently, the sealing resin MO is provided.

Figure 34:
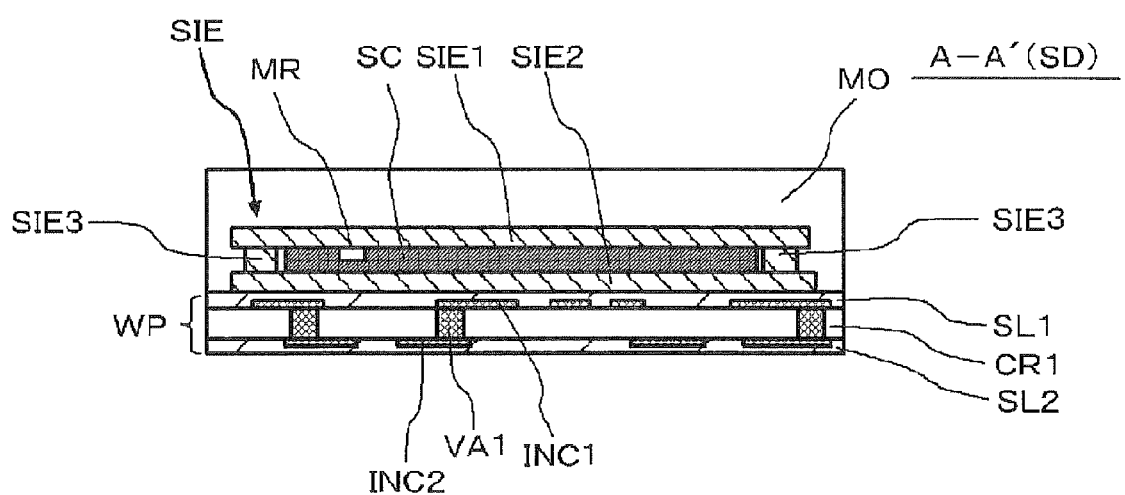
FIG. 34 is a cross-sectional view illustrating a configuration of the semiconductor device according to Thirteenth Modification.

As illustrated in FIG. 34, two sides of the semiconductor chip SC facing each other may also be provided with third shield members SIE3.

Also according to the present modification, it is possible to obtain the same effects as those in the embodiment, Seventh Modification, or Eighth Modification. In addition, none of the first shield member SIE1, the second shield member SIE2, and the third shield member SIE3 has a curved part in the cross-sectional direction. Therefore, there is less necessity to perform bending and the like upon forming the magnetic shield member SIE. Accordingly, the yield of the magnetic shield member SIE can be enhanced, and the manufacturing cost of a semiconductor device SD can be reduced.

(Fourteenth Modification)

Figure 35:
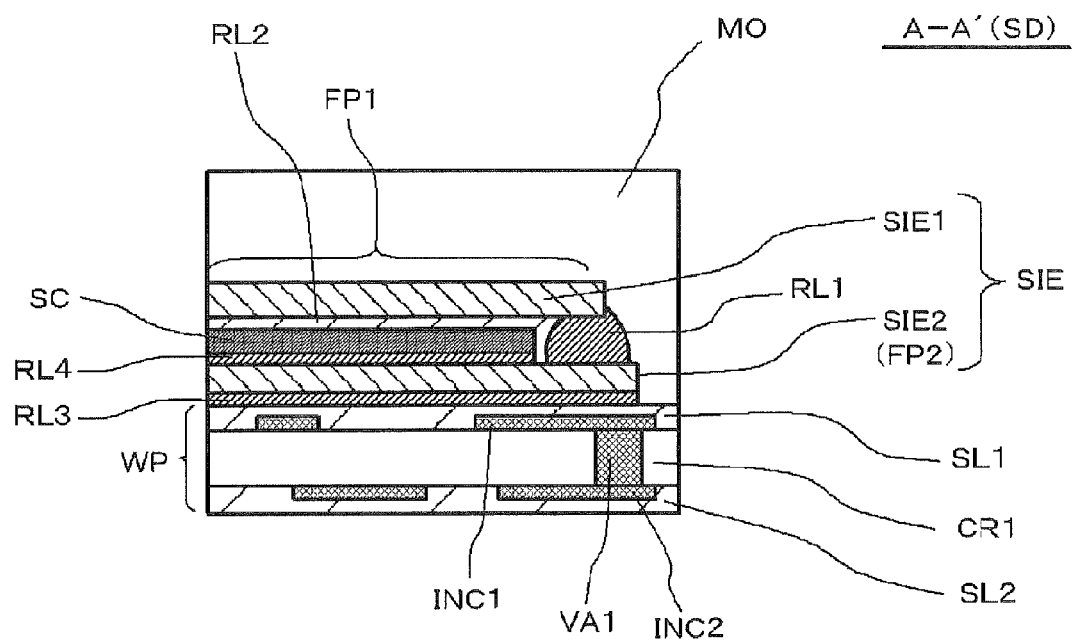
FIG. 35 is a cross-sectional view illustrating a configuration of a semiconductor device according to Fourteenth Modification.

FIG. 35 is a cross-sectional view illustrating a configuration of a semiconductor device SD according to Fourteenth Modification. FIG. 35 corresponds to FIG. 3 in the embodiment. The semiconductor device SD according to the present modification has the same configuration as that of the semiconductor device SD according to Eleventh Modification other than the following points.

First, the magnetic shield member SIE does not have a third shield member SIE3. Instead, the first facing region FP1 of the first shield member SIE1 and the second facing region FP2 of the second shield member SIE2 are coupled via a resin layer RL1. The magnetic shield member SIE according to the present modification is preferred in a case where the semiconductor chip SC is thin (for example, 50 μm or less). In the present modification, it is preferred that the resin layer RL1 contains a filler of a soft magnetic material. That is, in the present embodiment, the low magnetic resistance portion is configured with the resin layer RL1.

Also according to the present modification, it is possible to obtain the same effects as those in Eleventh Modification. In addition, since there is no necessity to use the third shield member SIE3, the manufacturing cost of a magnetic shield member SIE can further be reduced.

(Fifteenth Modification)

Figure 36:
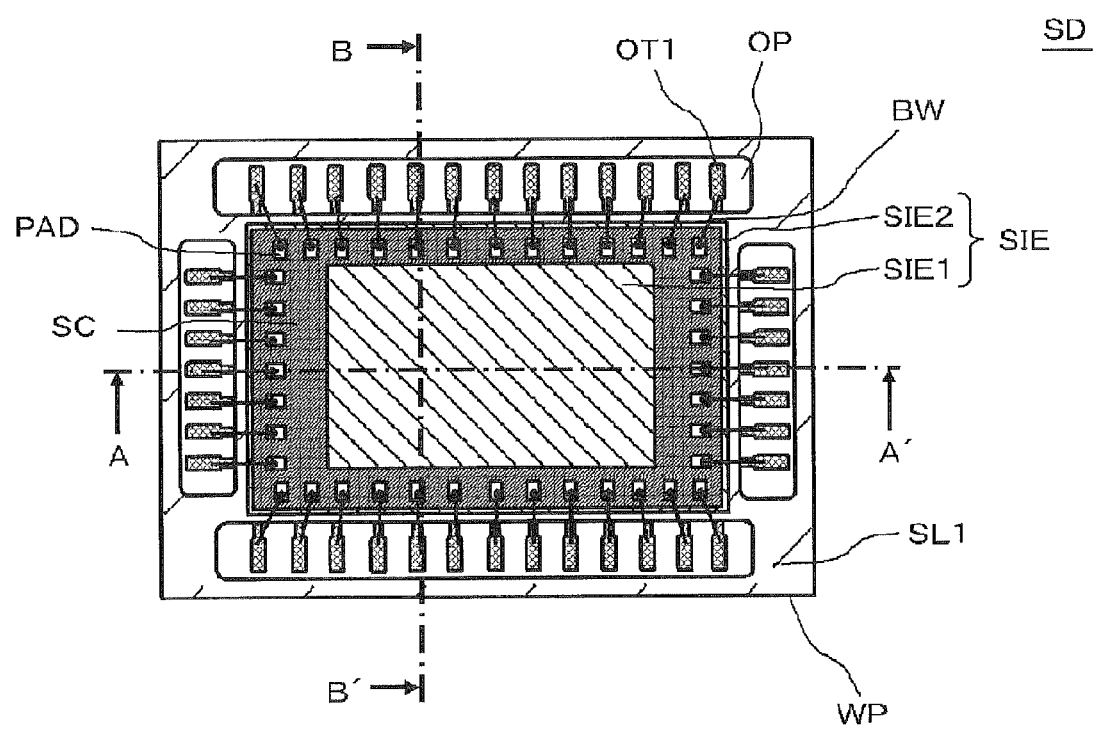
FIG. 36 is a plan view illustrating a configuration of a semiconductor device according to Fifteenth Modification.
Figure 37:
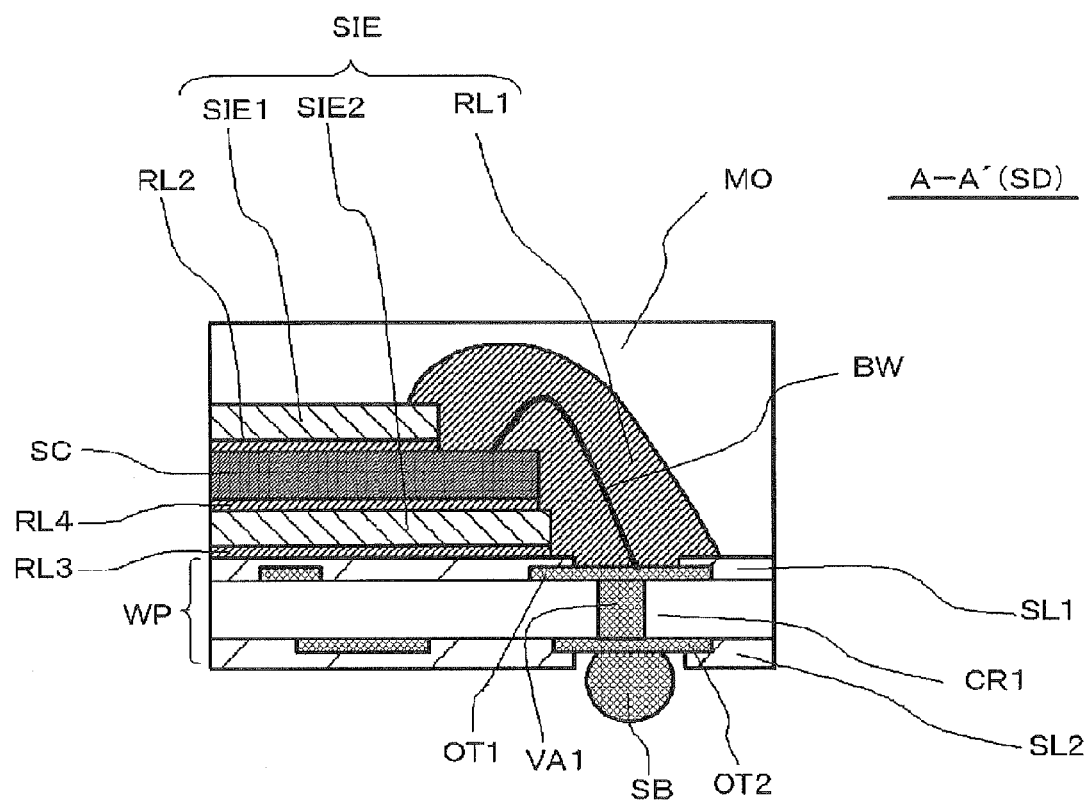
FIG. 37 is an enlarged view of the principal parts in an A-A' cross section of FIG. 36.

FIG. 36 is a plan view illustrating a configuration of a semiconductor device SD according to Fifteenth Modification. FIG. 37 is an enlarged view of the principal parts in an A-A' cross section of FIG. 36. FIG. 36 corresponds to FIG. 1 in the embodiment, and FIG. 37 corresponds to FIG. 3 in the embodiment. The semiconductor device SD according to the present modification has the same configuration as that of the semiconductor device SD according to the embodiment other than the following points.

First, the electrode pads PAD are disposed along the whole periphery in the semiconductor chip SC. The coupling terminals OT1 and the bonding wires BW are also disposed so as to surround the whole periphery of the semiconductor chip SC. Then, all parts of the first shield member SIE1 are located in a region surrounded by the electrode pads PAD on the active surface of the semiconductor chip SC in plan view.

Then, the resin layer RL1 covers an end face of the first shield member SIE1, an end face of the second shield member SIE2, the electrode pads PAD, the bonding wires BW, and the coupling terminals OT1.

Also according to the present embodiment, the first shield member SIE1 and the second shield member SIE2 are magnetically coupled via the resin layer RL1. Accordingly, it is possible to obtain the same effects as those in the embodiment. In addition, the electrode pads PAD can be disposed along the four sides of the semiconductor chip SC. Accordingly, the number of input/output terminals of the semiconductor chip SC can be made greater.

(Sixteenth Modification)

Figure 38:
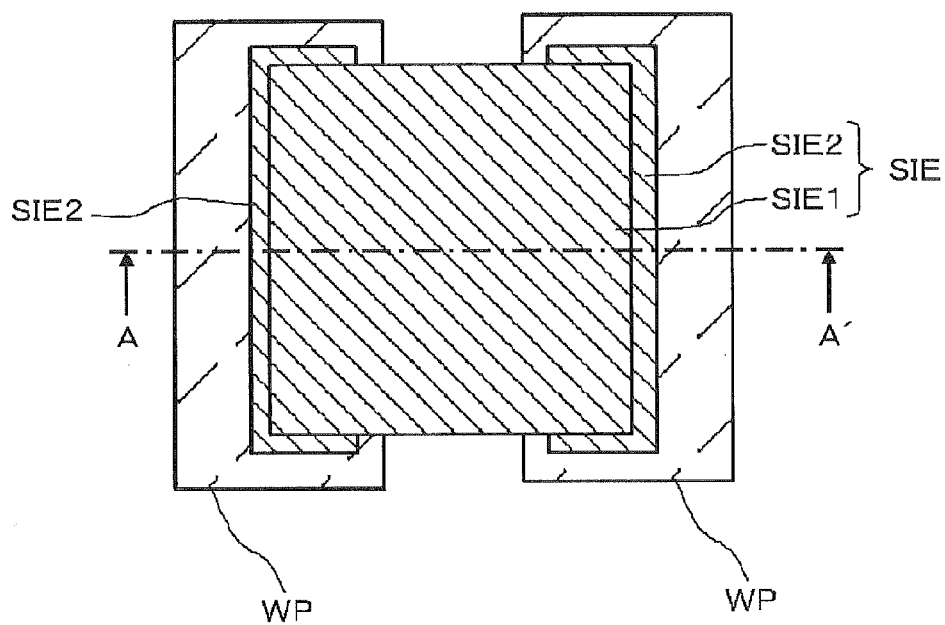
FIG. 38 is a plan view of a semiconductor device according to Sixteenth Modification.
Figure 39:
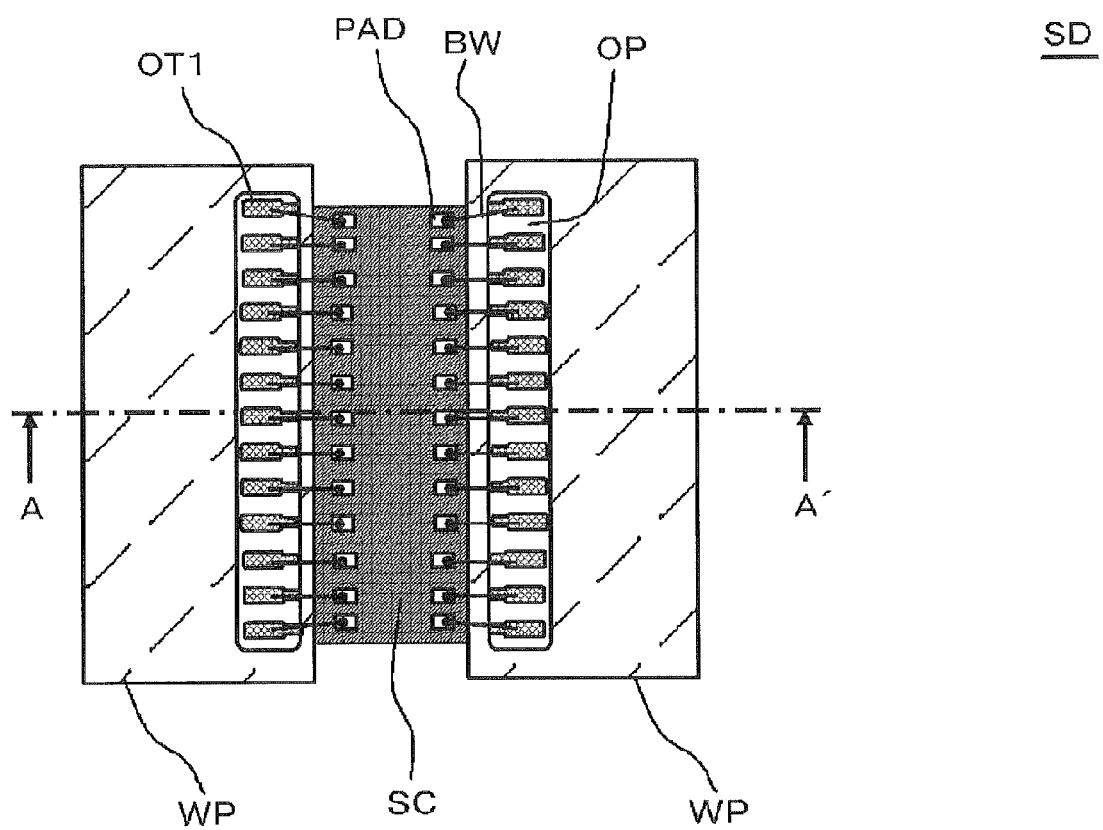
FIG. 39 is a bottom view of the semiconductor device illustrated in FIG. 38.
Figure 40:
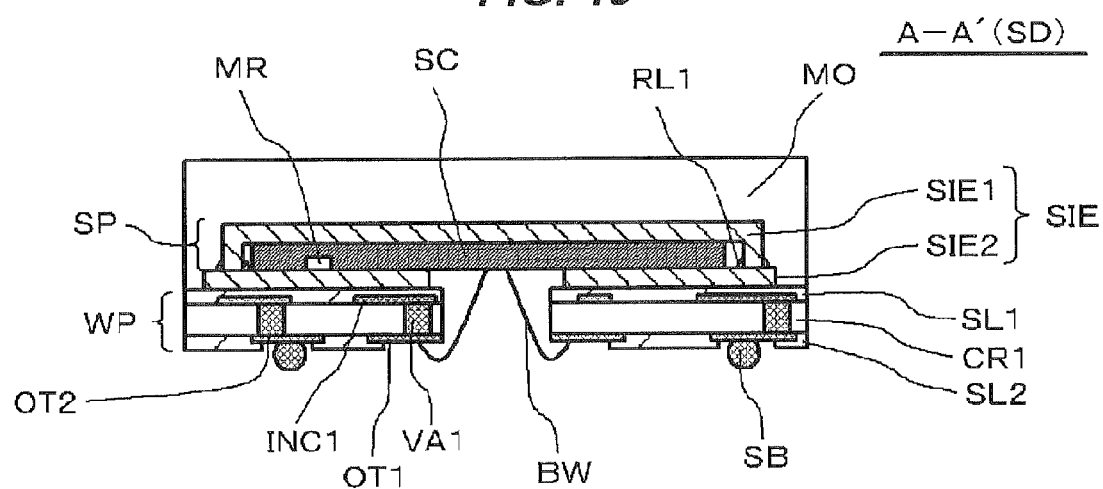
FIG. 40 is an A-A' cross-sectional view of FIG. 38.

FIG. 38 is a plan view of a semiconductor device SD according to Sixteenth Modification. FIG. 39 is a bottom view of the semiconductor device SD illustrated in FIG. 38, and FIG. 40 is an A-A' cross-sectional view of FIG. 38. The semiconductor device SD according to the embodiment has the same configuration as that of the semiconductor device SD according to the embodiment other than the following points. In FIG. 39, illustration of the coupling terminals OT2 and the solder balls SB is omitted.

First, the active surface of the semiconductor chip SC faces the second shield member SIE2. Then, the electrode pads PAD are provided in a central portion of the semiconductor chip SC.

The wiring board WP and the second shield member SIE2 are not located in a portion overlapping the electrode pads PAD. In the example illustrated in FIGS. 38, 39, and 40, both the wiring board WP and the second shield member SIE2 are divided into two. Then, the electrode pads PAD are located between the two wiring boards WP and also between the two second shield members SIE2 in plan view.

The first shield member SIE1 has a side facing region SP in each of two sides facing each other. The two second shield members SIE2 face the respective side facing regions SP different from each other. The structure of coupling portions of the first shield member SIE1 and the second shield members SIE2 may have a structure identical to any of First to Fourteenth Modifications.

The wiring boards WP have the coupling terminals OT1 on a surface opposite to the semiconductor chip SC. That is, in the present modification, the coupling terminals OT1 and the coupling terminals OT2 are formed on the same surface of the wiring boards WP.

According to the present embodiment, even in a case where the electrode pads PAD are provided in the central portion of the semiconductor chip SC, it is possible to obtain the same effects as those in the embodiment.

(Seventeenth Modification)

Figure 41:
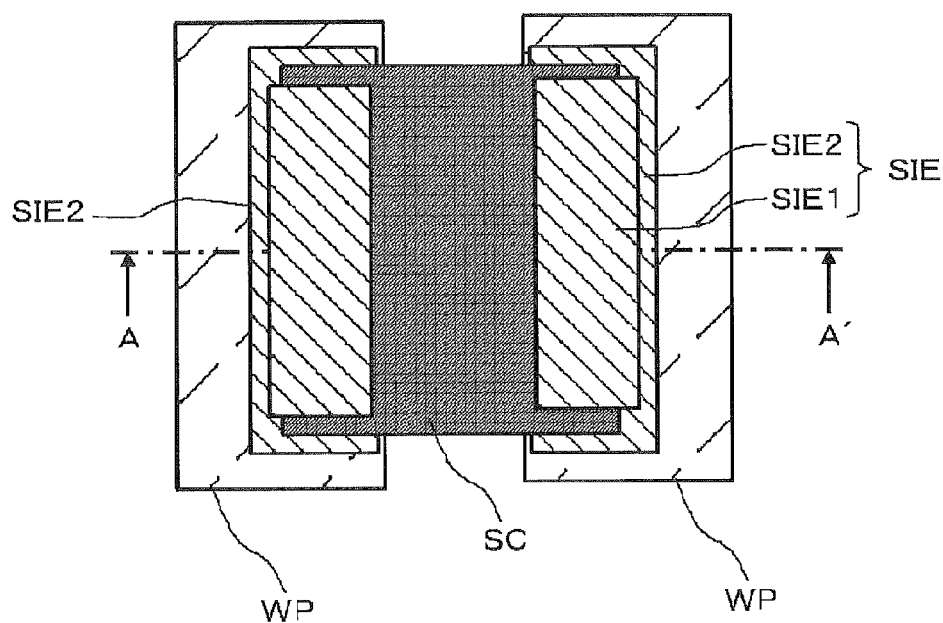
FIG. 41 is a plan view illustrating a configuration of a semiconductor device according to Seventeenth Modification.
Figure 42:
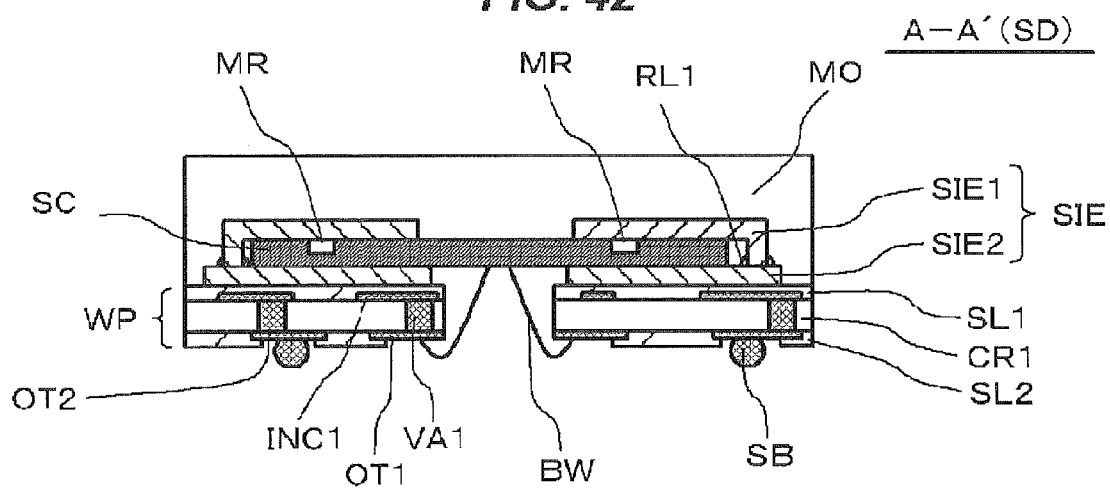
FIG. 42 is an A-A' cross-sectional view of FIG. 41.

FIG. 41 is a plan view illustrating a configuration of a semiconductor device SD according to Seventeenth Modification. FIG. 42 is an A-A' cross-sectional view of FIG. 41. The semiconductor device SD according to the present modification has the same configuration as that of the semiconductor device SD according to Sixteenth Modification other than that the first shield member SIE1 is also divided into two.

In detail, the first shield members SIE1 are located over the regions provided with magnetic memory cells MR, while they are not located in the region not provided with the magnetic memory cells MR (for example, the region overlapping the electrode pads PAD in plan view).

Also according to the present modification, it is possible to obtain the same effects as those in the embodiment. In addition, since the area of the first shield members SIE1 can be made smaller, there can be enhanced the intensity of an external magnetic field that is necessary before the magnetic shield member SIE generates the magnetic flux saturation phenomena, for the same reason as in Eighth Modification.

(Eighteenth Modification)

Figure 43:
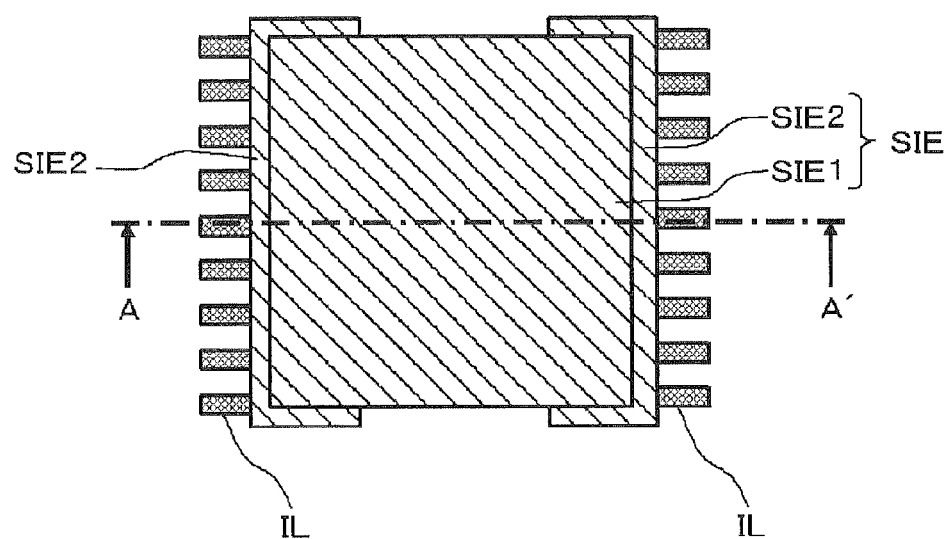
FIG. 43 is a plan view illustrating a configuration of a semiconductor device according to Eighteenth Modification.
Figure 44:
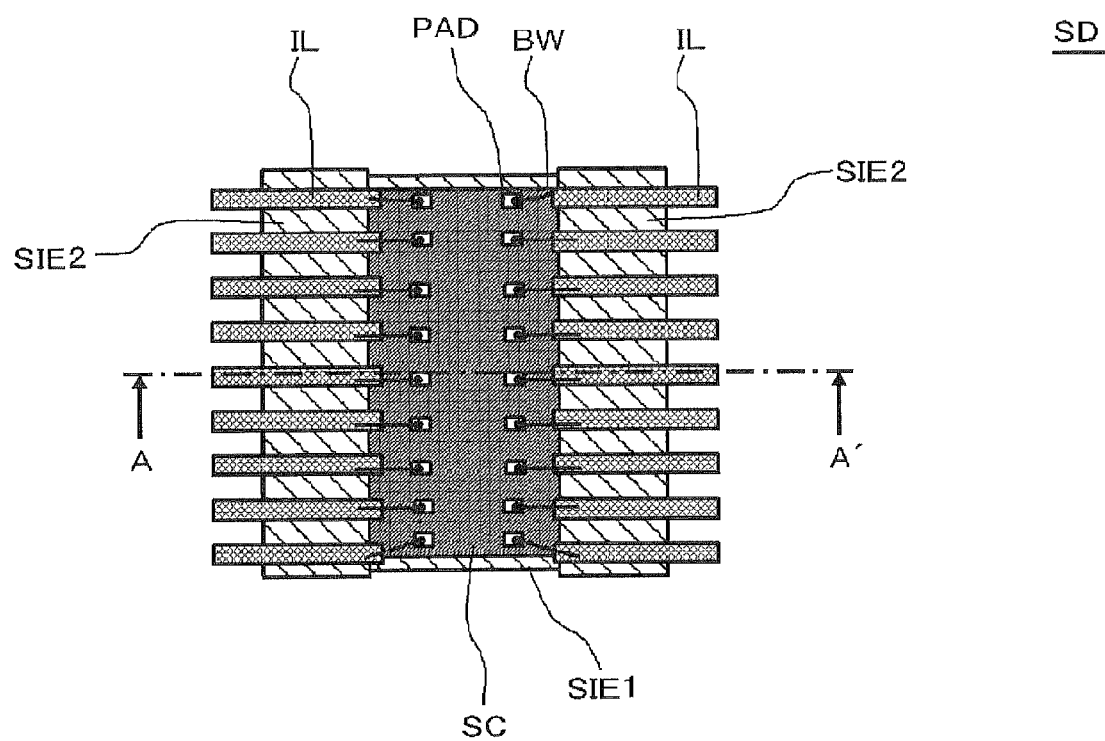
FIG. 44 is a bottom view of the semiconductor device illustrated in FIG. 43.
Figure 45:
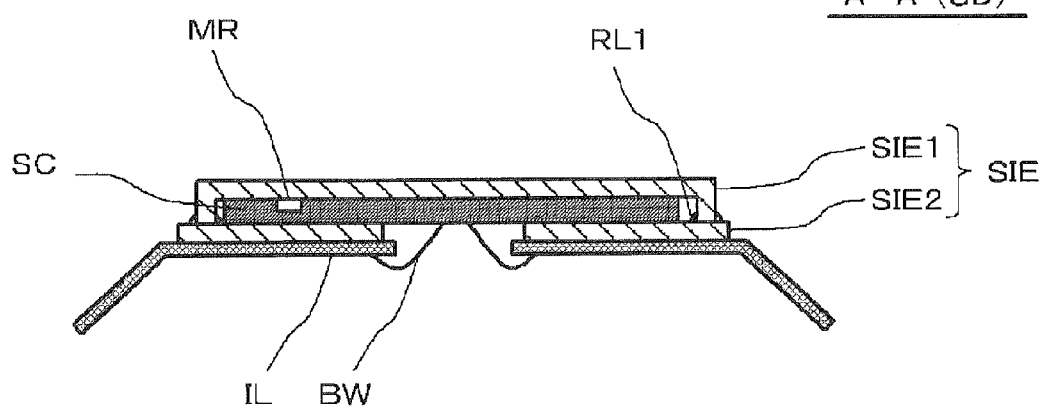
FIG. 45 is an A-A' cross-sectional view of FIG. 43.

FIG. 43 is a plan view illustrating a configuration of a semiconductor device SD according to Eighteenth Modification. FIG. 44 is a bottom view of the semiconductor device SD illustrated in FIG. 43, and FIG. 45 is an A-A' cross-sectional view of FIG. 43. The semiconductor device SD according to the present embodiment has the same configuration as that of the semiconductor device SD according to Sixteenth Modification other than the following points.

In the present modification, the semiconductor device SD has an LOC (Lead on Chip) structure. In detail, the semiconductor device SD has a lead frame instead of the wiring board WP. In detail, the second shield members SIE2 of the magnetic shield member SIE are coupled over leads IL of the lead frame. Then, the bonding wires BW couple the leads IL to the electrode pads PAD of the semiconductor chip SC. Note that, as illustrated in FIGS. 44 and 45, in plan view, the leads IL extend closer to the electrode pads PAD than the second shield members SIE2.

Figure 46:
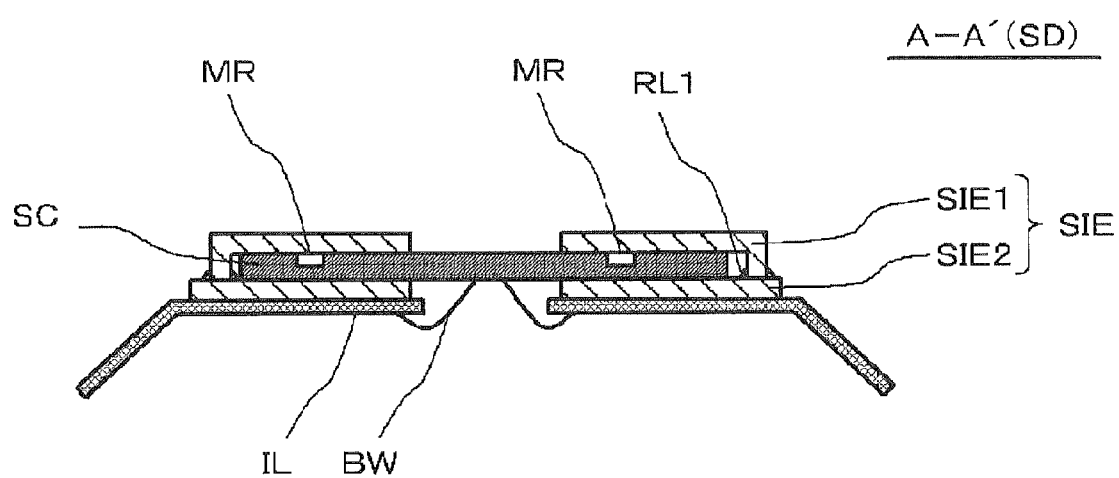
FIG. 46 is a cross-sectional view illustrating a configuration of the semiconductor device according to Eighteenth Modification.

As illustrated in a cross-sectional view of FIG. 46, the first shield member SIE1 may also be divided into two as in Seventeenth Modification.

Figure 47:
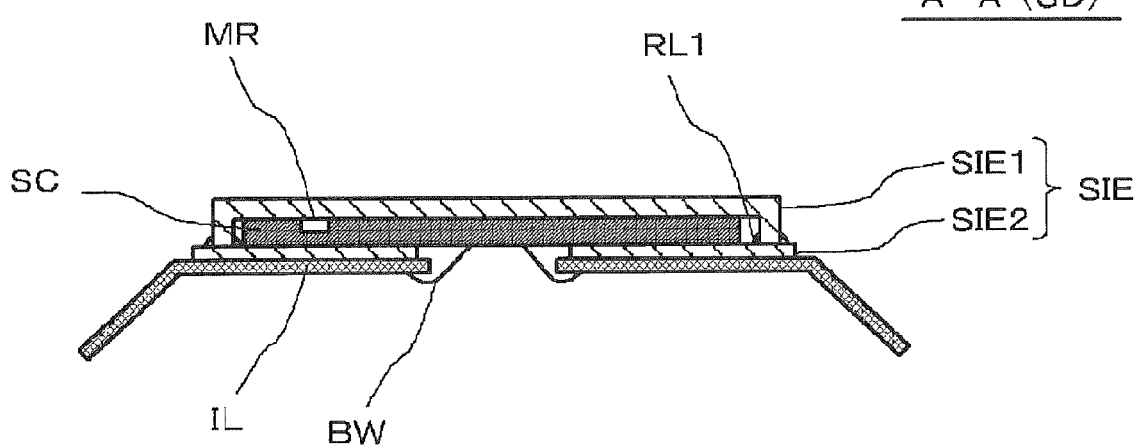
FIG. 47 is a cross-sectional view illustrating a configuration of the semiconductor device according to Eighteenth Modification.

As illustrated in a cross-sectional view of FIG. 47, the second shield members SIE2 may also be thinner than the first shield member SIE1.

According to the present modification, even in a case where the semiconductor device SD has an LOC structure, it is possible to obtain the same effects as those in the embodiment. In addition, in a case where the second shield members SIE2 are made thinner than the first shield member SIE1 as illustrated in FIG. 47, the bonding wires BW can be made shorter.

(Nineteenth Modification)

Figure 48:
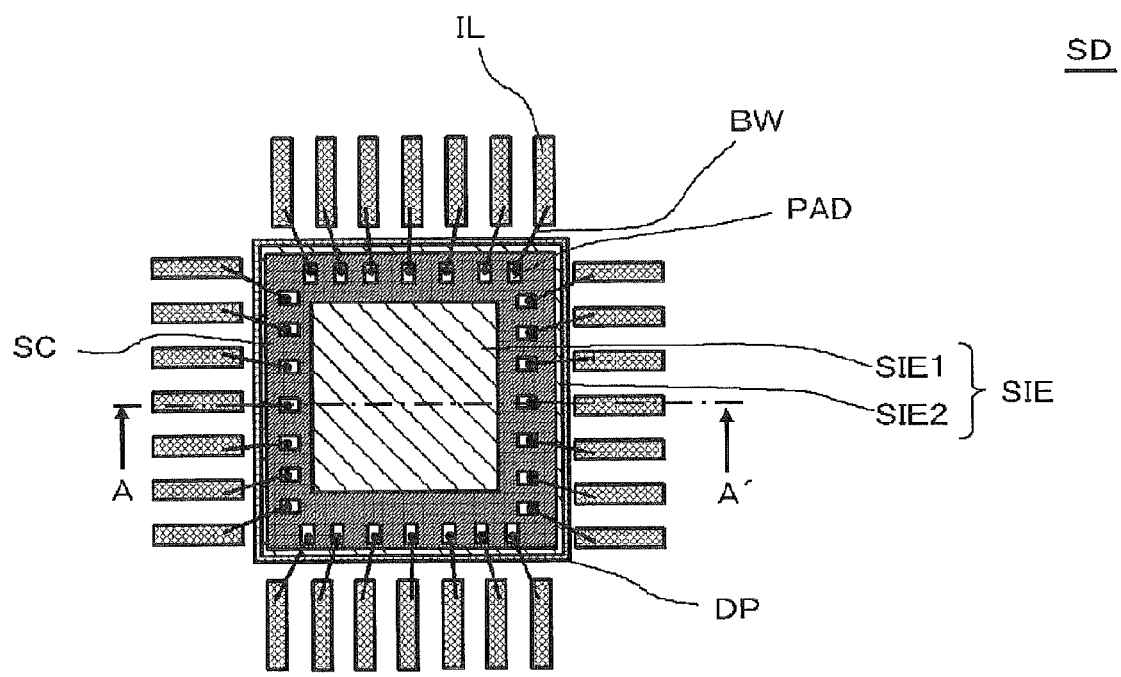
FIG. 48 is a plan view illustrating a configuration of a semiconductor device according to Nineteenth Modification.
Figure 49:
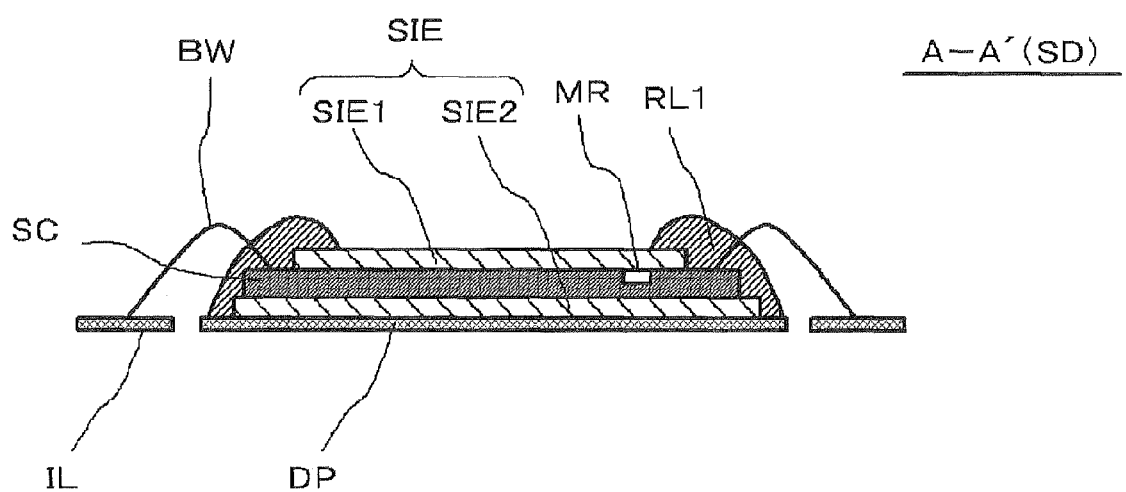
FIG. 49 is an A-A' cross-sectional view of FIG. 48.

FIG. 48 is a plan view illustrating a configuration of a semiconductor device SD according to Nineteenth Modification. FIG. 49 is an A-A' cross-sectional view of FIG. 48. The semiconductor device SD according to the present modification has the same configuration as that of the semiconductor device SD according to Eighteenth Modification other than the following points.

In the present modification, the semiconductor device SD is a QFP (Quad Flat Package). That is, the active surface of the semiconductor chip SC has the electrode pads PAD in the four sides thereof. The leads IL are provided on the four sides of the semiconductor chip SC. The bonding wires BW couple the electrode pads PAD to the leads IL.

The second shield members SIE2, the semiconductor chip SC, and the first shield member SIE1 are disposed over a die pad DP. Then, the first shield member SIE1 and the second shield member SIE2 have the same structure as the structure illustrated in FIGS. 36 and 37. The resin layer RL1 covers peripheral parts of the first shield member SIE1 and the second shield member SIE2, a portion exposed from the first shield member SIE1 of the semiconductor chip SC, and a peripheral part of the die pad DP.

According to the present modification, even in a case where the semiconductor device SD has a QFP structure, it is possible to obtain the same effects as those of the embodiment.

(Twentieth Modification)

Figure 50:
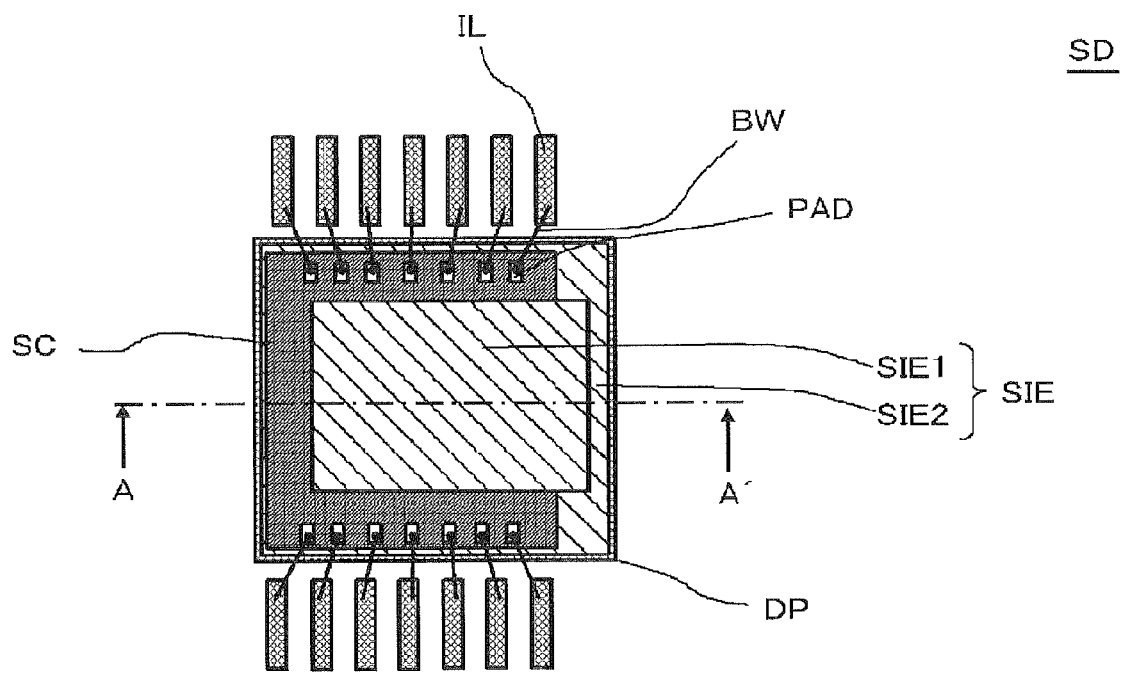
FIG. 50 is a plan view illustrating a configuration of a semiconductor device according to Twentieth Modification.
Figure 51:
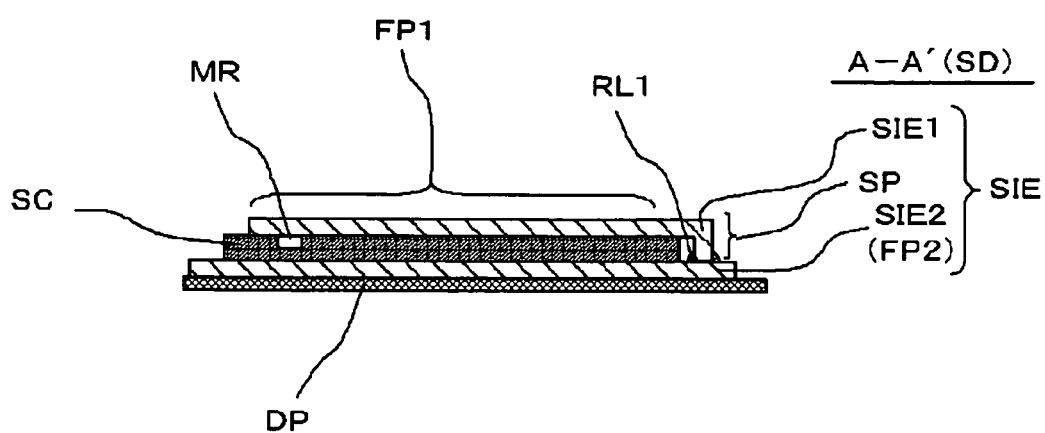
FIG. 51 is an A-A' cross-sectional view of FIG. 50.

FIG. 50 is a plan view illustrating a configuration of a semiconductor device SD according to Twentieth Modification. FIG. 51 is an A-A' cross-sectional view of FIG. 50. The semiconductor device SD according to the present modification has the same configuration as that of the semiconductor device SD according to Nineteenth Modification other than the following points.

First, the semiconductor device SD according to the present modification has a TSOP (Thin Small Outline Package). Then, the leads IL are provided along two sides of the semiconductor chip SC facing each other. The first shield member SIE1 of the magnetic shield member SIE has a side facing region SP, and this side facing region SP faces the second shield members SIE2.

According to the present modification, even in a case where the semiconductor device SD has a TSOP structure, it is possible to obtain the same effects as those in the embodiment.

(Twenty-First Modification)

Figure 52A:
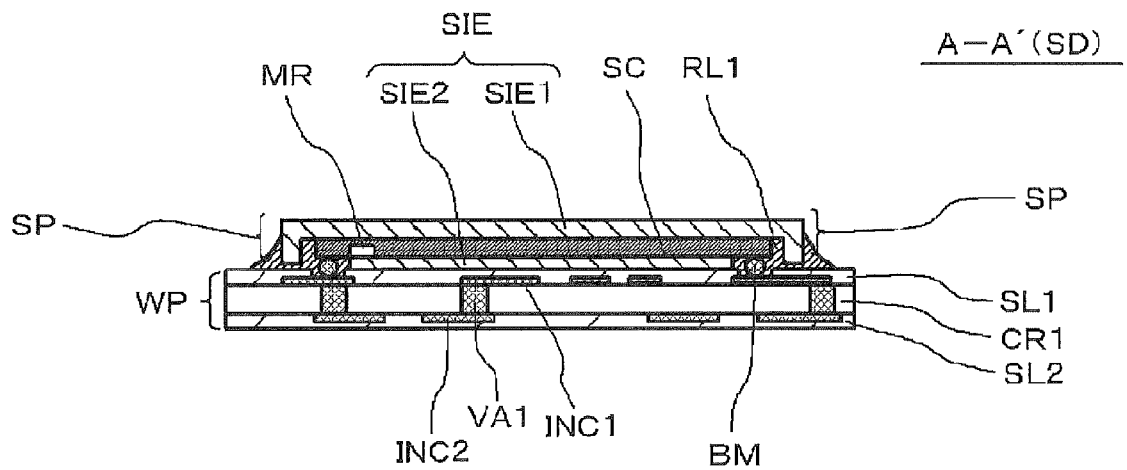
FIGS. 52A and 52B are cross-sectional views illustrating a configuration of a semiconductor device according to Twenty-First Modification.
Figure 52B:
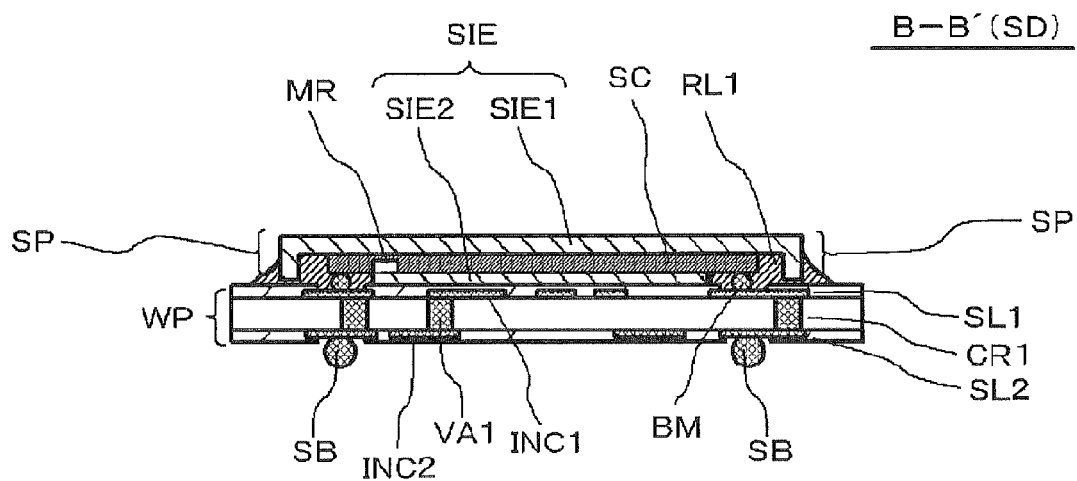
Figure 53:
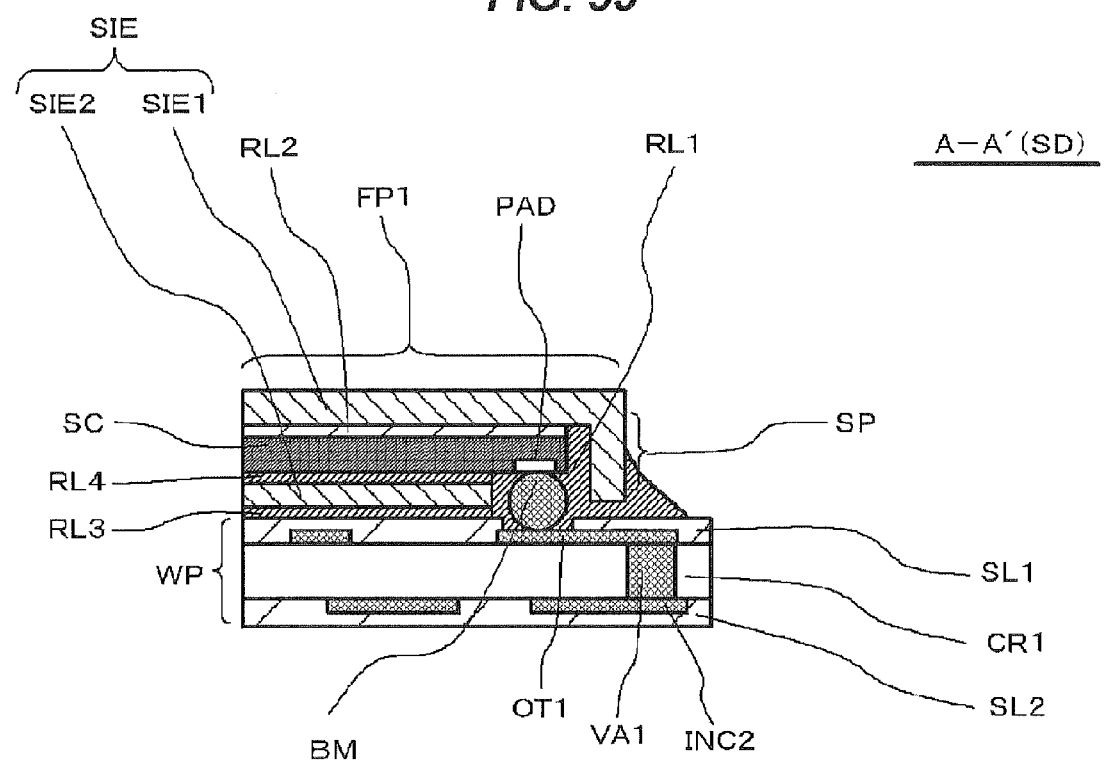
FIG. 53 is a cross-sectional view of enlarging the principal parts of FIG. 52A.

FIGS. 52A and 52B are cross-sectional views illustrating a configuration of a semiconductor device SD according to Twenty-First Modification. FIG. 52A corresponds to FIG. 2A in the embodiment, and FIG. 52B corresponds to FIG. 2B in the embodiment. FIG. 53 is a cross-sectional view of enlarging the principal parts of FIG. 52A, and corresponds to FIG. 3 in the embodiment. The semiconductor device SD according to the present embodiment has the same configuration as that of the semiconductor device SD according to the embodiment other than the following points.

First, the semiconductor device SD is flip-chip coupled to the wiring board WP. In detail, the active surface of the semiconductor device SD faces the wiring board WP, and the electrode pads PAD are coupled to the coupling terminals OT1 of the wiring board WP via respective bumps BM.

The side facing region SP of the first shield member SIE1 is provided on the whole periphery of the first shield member SIE1. The second shield member SIE2 is located in a region surrounded by the electrode pads PAD on the active surface of the semiconductor chip SC. Then, a space between the side facing region SP of the first shield member SIE1 and the semiconductor chip SC and a space between the semiconductor chip SC and the wiring board WP are filled with the resin layer RL1. That is, the side facing region SP of the first shield member SIE1 is magnetically coupled to the second shield member SIE2 via the resin layer RL1.

Figure 54:
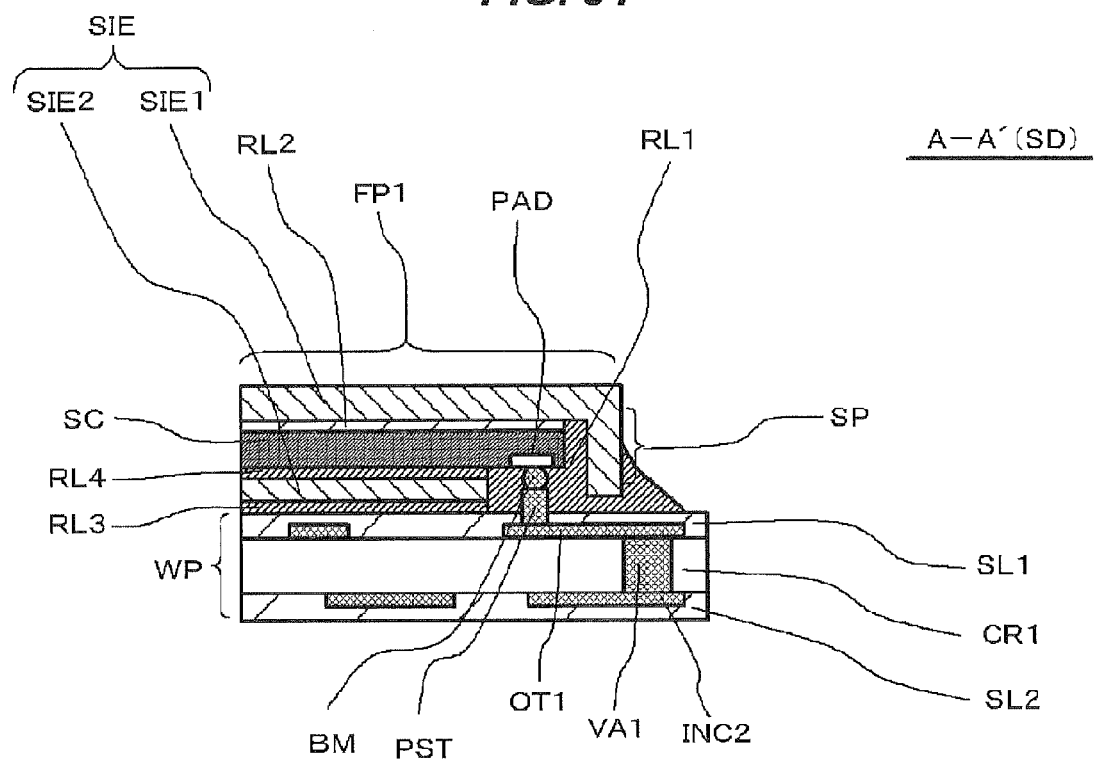
FIG. 54 is a cross-sectional view of enlarging the principal parts of FIG. 52A.

Note that, as illustrated in FIG. 54, a conductive post PST may also be provided between the coupling terminal OT1 and the bump BM.

According to the present modification, even when the semiconductor chip SC is flip-chip coupled to the wiring board WP, it is possible to obtain the same effects as those in the embodiment.

(Twenty-Second Modification)

Figure 55:
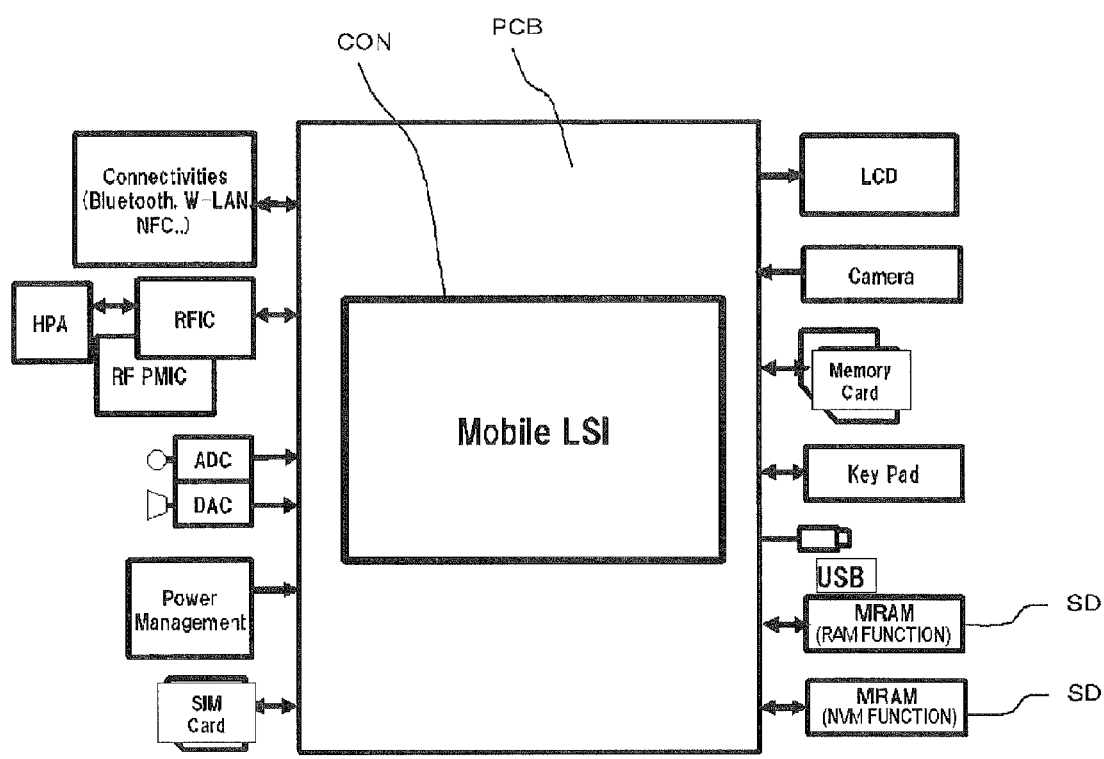
FIG. 55 is a functional block diagram of a device according to Twenty-Second Modification.

FIG. 55 is a functional block diagram of a device according to Twenty-Second Modification. The device according to the present modification is a mobile communication terminal and has a controlling semiconductor chip CON. The mobile communication terminal is, for example, a mobile phone terminal, a mobile personal computer, or a mobile game machine. The controlling semiconductor chip CON is coupled to various devices via a circuit board PCB. The devices to be coupled thereto are, for example, communication devices (Connectivities), an RFIC, an HPA, an RFPMIC, an ADC, a DAC, a power control device (Power management), a SIM card, a display device (LCD), an imaging device (Camera), a memory card, a key pad, a USB terminal, a RAM (semiconductor device SD), and an NVM (semiconductor device SD). Then, information, such as an image taken by the imaging device or communication record, is stored in the magnetic memory cell MR of the semiconductor device SD. Such memory control is carried out by the controlling semiconductor chip CON.

(Twenty-Third Modification)

Figure 56:
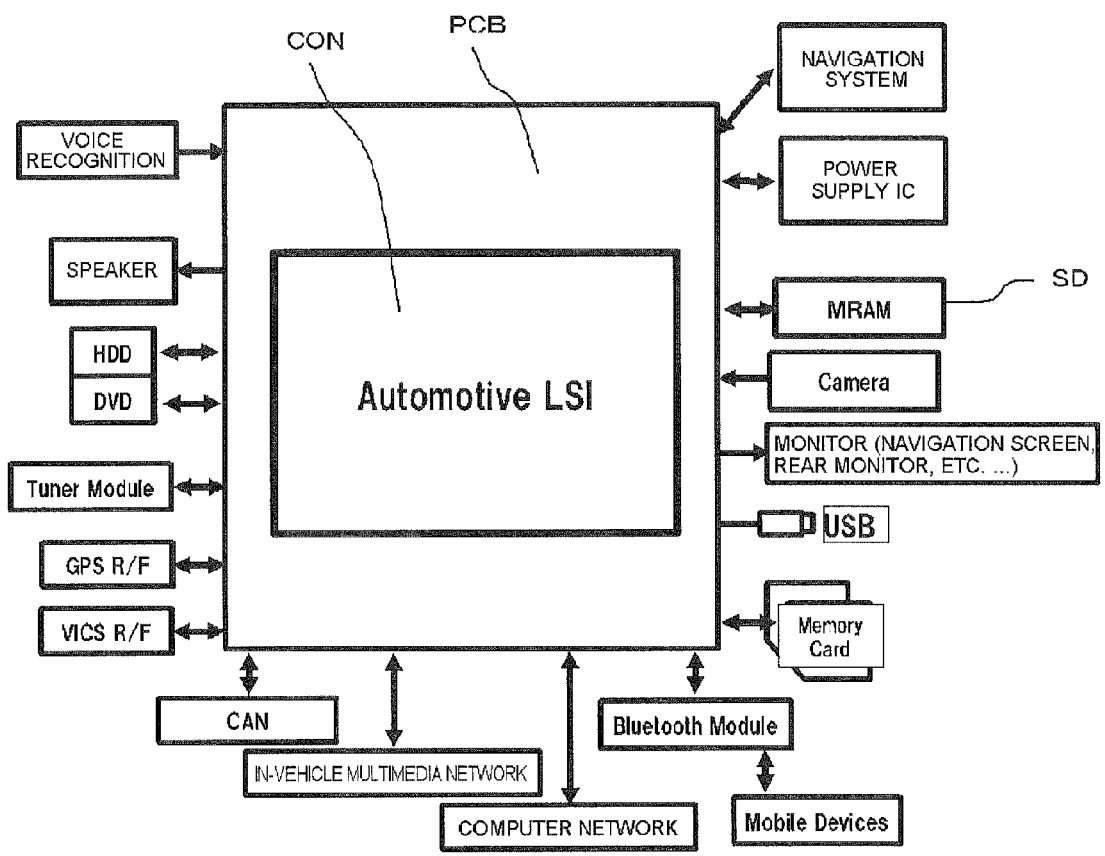
FIG. 56 is a functional block diagram of a device according to Twenty-Third Modification.

FIG. 56 is a functional block diagram of a device according to Twenty-Third Modification. The device according to the present modification is a vehicle and has a controlling semiconductor chip CON. The controlling semiconductor chip CON is coupled to various electrical devices in the vehicle via a circuit board PCB. These electrical devices to be coupled thereto are, for example, a voice recognition device, a speaker, an HDD, a DVD, a tuner module, a GPS system, a traffic information communication device (for example, the VICS® system), a CAN (controller area network), an in-vehicle multimedia network, a computer network, a bluetooth system, a memory card system, a USB terminal, a monitor, an imaging device (Camera), an MRAM (semiconductor device SD), a navigation system, and a power supply IC. Then, information, such as information used in the navigation system or an image taken by the imaging device, is stored in the magnetic memory cell MR of the semiconductor device SD.

As described above, although the present invention made by the present inventor has been described specifically on the basis of the embodiments, the present invention is not limited to the embodiments and it is needless to say that various modifications are possible within a scope not departing from the gist of the invention.

What is claimed is:

1. A semiconductor device, comprising:
    a semiconductor chip including a first surface and a second surface opposite the first surface, and having a magnetic memory cell; and
    a magnetic shield member covering a region provided with the magnetic memory cell in the semiconductor chip,
    wherein the magnetic shield member includes
        a first shield member including a first surface facing the first surface of the semiconductor chip, and a side surface facing a side of the semiconductor chip;
        a second shield member including a first surface facing the second surface of the semiconductor chip, an outer portion of the first surface of the second shield member extending from the side of the semiconductor chip to outside the first shield member, and
        a resin layer formed on the outer portion of the first surface of the second shield member and including a portion making contact with the side surface of the first shield member and another portion making contact with the second shield member.

2. The semiconductor device according to claim 1,
    wherein the resin layer makes contact with an end portion of a side facing region of the first shield member, the side facing region including the side surface, and
    the end portion of the side facing region has an inclined surface inclined relative to the second facing region of the second shield member.

3. The semiconductor device according to claim 1,
    wherein the resin layer makes contact with an end portion of a side facing region of the first shield member, the side facing region including the side surface, and
    the end portion of the side facing region has a convex portion on a side closer to the semiconductor chip in a thickness direction of the first shield member.

4. The semiconductor device according to claim 1,
    wherein the resin layer makes contact with an end of a side facing region of the first shield member, the side facing region including the side surface, and
    the end of the side facing region is located on a side closer to the first surface than the second surface of the semiconductor chip.

5. The semiconductor device according to claim 1,
    wherein the first shield member comprises a laminated material in which a resin layer and a soft magnetic material layer are laminated repeatedly.

6. The semiconductor device according to claim 1, further comprising a sealing resin that seals the semiconductor chip,
    wherein the resin layer comprises the sealing resin,
    at least a part of an end portion of the second shield member is exposed from a surface facing the side of the semiconductor chip of an outer surface of the sealing resin, and
    the first shield member is provided along a surface facing the first surface of the semiconductor chip and a surface facing the side of the outer surface of the sealing resin.

7. The semiconductor device according to claim 1, further comprising a third shield member that is located in the resin layer and that faces a side of the semiconductor chip.

8. The semiconductor device according to claim 7,
    wherein the third shield member has a width, when viewed from a surface parallel to the first facing region, larger than a thickness of the first shield member.

9. The semiconductor device according to claim 7,
    wherein the third shield member has a width, when viewed from a surface parallel to the first facing region, larger than a thickness of the third shield member.

10. The semiconductor device according to claim 7,
    wherein the third shield member is formed of a material having a saturation magnetic flux density higher than that of the first shield member and the second shield member.

11. The semiconductor device according to claim 1,
    wherein the resin layer has a filler having a soft magnetic material.

12. The semiconductor device according to claim 1, further comprising a sealing resin that seals the semiconductor chip,
    wherein the sealing resin and the resin layer contain a filler, and
    the filler of the resin layer has an average particle diameter smaller than an average particle diameter of the filler of the sealing resin.

13. The semiconductor device according to claim 1, further comprising a plurality of electrode pads provided on an active surface of the semiconductor chip,
    wherein a member facing the active surface among the first shield member and the second shield member does not overlap with the electrode pads in plan view.

14. The semiconductor device according to claim 13, further comprising:
    a plurality of bonding wires having one end thereof coupled to the electrode pads; and
    external coupling terminals coupled to another end of the bonding wires.

15. The semiconductor device according to claim 1, wherein the first surface of the first shield member is formed on the first surface of the semiconductor chip.

16. The semiconductor device according to claim 1, further comprising:
    an other resin layer formed on the first surface of the semiconductor chip, the first surface of the first shield member being formed on a surface of the other resin layer.

17. A magnetic shield member for shielding a magnetic memory cell formed in a semiconductor chip including a first surface and a second surface opposite the first surface, the magnetic shield member comprising:
- a first shield member including a first surface facing the first surface of the semiconductor chip, and a side surface facing a side of the semiconductor chip;
- a second shield member including a first surface facing the second surface of the semiconductor chip, an outer portion of the first surface of the second shield member extending from the side of the semiconductor chip to outside the first shield member; and
- a resin layer formed on the outer portion of the first surface of the second shield member and between the first shield member and the second shield member, and contacting the side surface of the first shield member.

18. A semiconductor device, comprising:
- a semiconductor chip including a first surface and a second surface opposite the first surface, and having a magnetic memory cell;
- a magnetic shield member covering a region provided with the magnetic memory cell in the semiconductor chip, the magnetic shield member comprising:
  - a first shield member comprising:
    - a first surface facing the first surface of the semiconductor chip; and
    - a second surface facing a side of the semiconductor chip;
  - a second shield member including a first surface facing the second surface of the semiconductor chip, an outer portion of the first surface of the second shield member extending from a side of the semiconductor chip to outside the first shield member; and
  - a resin layer formed on the outer portion of the first surface of the second shield member and between the second surface of the first shield member and the outer portion of the first surface of the second shield member, and contacting the second surface of the first shield member; and
- a sealing resin that seals the semiconductor chip, an average particle diameter of a filler of the resin layer being less than an average particle diameter of a filler of the sealing resin.

* * * * *